(12) United States Patent
Son et al.

(10) Patent No.: US 9,917,298 B2
(45) Date of Patent: Mar. 13, 2018

(54) COMPOSITE, METHOD OF PREPARING THE SAME, ELECTRODE INCLUDING THE COMPOSITE, AND LITHIUM BATTERY INCLUDING THE ELECTRODE

(71) Applicant: Samsung Electronics Co., Ltd., Suwon-si, Gyeonggi-do (KR)

(72) Inventors: Inhyuk Son, Yongin-si (KR); Jonghwan Park, Yongin-si (KR); Seongyong Park, Yongin-si (KR); Jaeman Choi, Seongnam-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 40 days.

(21) Appl. No.: 15/094,527

(22) Filed: Apr. 8, 2016

(65) Prior Publication Data

US 2017/0062804 A1    Mar. 2, 2017

(30) Foreign Application Priority Data

Aug. 28, 2015   (KR) .......................... 10-2015-0121832

(51) Int. Cl.
  *H01M 4/134*   (2010.01)
  *H01M 4/66*    (2006.01)
  (Continued)

(52) U.S. Cl.
  CPC ......... *H01M 4/134* (2013.01); *H01M 4/0404* (2013.01); *H01M 4/0428* (2013.01);
  (Continued)

(58) Field of Classification Search
  CPC ....... H01M 10/0525; H01M 2004/027; H01M 2300/0034; H01M 2300/004;
  (Continued)

(56) References Cited

U.S. PATENT DOCUMENTS

2011/0159368 A1*  6/2011  Hirose ................. H01M 4/134
                                                 429/219
2014/0038042 A1   2/2014  Rios et al.
(Continued)

FOREIGN PATENT DOCUMENTS

CN      103305965 A    9/2013
JP      2013089403 A   5/2013
(Continued)

OTHER PUBLICATIONS

Z. Zhao, M. Li, K.-H. Chang, Y.-M. Lin. Composites of graphene and encapsulated silicon for practically viable high-performance lithium-ion batteries, Nano Research 2014, 7(10): 1429-1438.*
(Continued)

*Primary Examiner* — Carlos Barcena
(74) *Attorney, Agent, or Firm* — Cantor Colburn LLP

(57) ABSTRACT

A composite includes a carbonaceous material; a plurality of silicon structures disposed on the carbonaceous material; and a graphene layer, which comprises graphene and is disposed on the plurality of silicon structures, wherein a silicon structure of the plurality of silicon structures includes silicon and a silicon oxide of the formula $SiO_x$ which is disposed on a surface of the silicon, wherein $0<x<2$. Also a method of preparing the composite, an electrode including the composite, and a lithium battery including the electrode.

26 Claims, 30 Drawing Sheets

(51) Int. Cl.
- *H01M 4/38* (2006.01)
- *H01M 4/04* (2006.01)
- *H01M 4/36* (2006.01)
- *H01M 4/62* (2006.01)
- *H01M 4/1395* (2010.01)
- *H01M 10/0525* (2010.01)
- *H01M 4/02* (2006.01)

(52) U.S. Cl.
CPC ....... *H01M 4/0471* (2013.01); *H01M 4/1395* (2013.01); *H01M 4/366* (2013.01); *H01M 4/386* (2013.01); *H01M 4/625* (2013.01); *H01M 4/663* (2013.01); *H01M 10/0525* (2013.01); *H01M 2004/027* (2013.01); *H01M 2300/004* (2013.01); *H01M 2300/0034* (2013.01)

(58) Field of Classification Search
CPC ............. H01M 4/0404; H01M 4/0428; H01M 4/0471; H01M 4/134; H01M 4/1395; H01M 4/366; H01M 4/386; H01M 4/625; H01M 4/663
See application file for complete search history.

(56) References Cited

U.S. PATENT DOCUMENTS

| | | |
|---|---|---|
| 2014/0178754 A1 | 6/2014 | Kim et al. |
| 2014/0255500 A1 | 9/2014 | Son et al. |
| 2014/0255781 A1 | 9/2014 | Son et al. |
| 2015/0093648 A1 | 4/2015 | Son et al. |
| 2015/0111106 A1 | 4/2015 | Son et al. |
| 2015/0380728 A1 | 12/2015 | Son et al. |

FOREIGN PATENT DOCUMENTS

| | | |
|---|---|---|
| KR | 1020140023858 A | 2/2014 |
| KR | 1020140081679 A | 7/2014 |
| KR | 1020140110703 A | 9/2014 |
| KR | 1020140111548 A | 9/2014 |
| KR | 1020150039555 A | 4/2015 |
| KR | 1020150045337 A | 4/2015 |
| KR | 1020150141473 A | 12/2015 |

OTHER PUBLICATIONS

H.-C. Tao, X.-L. Yang, L.-L. Zhang, S.-B. Ni. Chemically activated graphene/porous Si@SiOx composite as anode for lithium ion batteries, Materials Chemistry and Physics 147 (2014) 528-534.*

Y.-S. Hu, R. R. Demir-Cakan, M.-M. Titirici, J.-O. Muller, R. Schlogl, M. Antonietti, J. Maier. Superior Storage Performance of a Si@SiOx/C Nanocomposite as Anode Material for Lithium-Ion Batteries, Angew. Chem. Int. Ed. 2008, 47, 1645-1649.*

S. Sim , P. Oh , S. Park , J. Cho. Critical Thickness of SiO 2 Coating Layer on Core@Shell Bulk@Nanowire Si Anode Materials for Li-Ion Batteries, Adv. Mater. 2013, 25, 4498-4503.*

C.J. Shearer, A.D. Slattery, A.J. Stapleton, J.G. Shapter, C.T. Gibson. Accurate thickness measurement of graphene, Nanotechnology 27 (2016) 125704 (10pp).*

Evanoff et al., "Ultra Strong Silicon-Coated Carbon Nanotube Nanwoven Fabric as a Multifunctional Lithium-Ion Battery Anode", ACS Nano, vol. 6, No. 11, 2012, pp. 9837-9845.

Lin et al., "Twisted Aligned Carbon Nanotube/Silicon Composite Fiber Anode for Flexible Wire-Shaped Lithium-Ion Battery", Advanced Materials, vol. 26, 2014, pp. 1217-1222.

Liu et al., "Hierarchical silicon nanowires-carbon textiles matrix as a binder-free anode for high-performance advanced lithium-ion batteries", Scientific Reports, vol. 3, 2013, pp. 1-7.

Zhou et al., "Progress in flexible lithium batteries and future prospects", Energy & Environmental Science, vol. 7, 201, pp. 1307-1338.

\* cited by examiner

COMPOSITE, METHOD OF PREPARING THE SAME, ELECTRODE INCLUDING THE COMPOSITE, AND LITHIUM BATTERY INCLUDING THE ELECTRODE

CROSS-REFERENCE TO RELATED APPLICATION

This application claims priority to and the benefit of Korean Patent Application No. 10-2015-0121832, filed on Aug. 28, 2015, in the Korean Intellectual Property Office, and all the benefits accruing therefrom under 35 U.S.C. §119, the content of which is incorporated herein in its entirety by reference.

BACKGROUND

1. Field

The present disclosure relates to a composite, a method of preparing the composite, an electrode including the composite, and a lithium battery including the electrode.

2. Description of the Related Art

Silicon has been studied for use as a negative electrode material for a lithium battery because silicon has a high theoretical capacity and a low cost. However, silicon undergoes a large volume expansion during discharge of a battery, and the silicon active material is understood to become electrically isolated from the electrode due to the large volume expansion. Also, electrolyte decomposition increases as a specific surface area of the silicon increases due to the volume expansion. In this regard, a silicon structure that reduces the volume expansion of the silicon and has less of the pulverization phenomenon during the volume expansion has been developed.

However, battery charging/discharging efficiency when using an available silicon material is still not satisfactory. Thus there remains a need for an improved silicon negative electrode active material.

SUMMARY

Provided is a composite.
Provided is a method of preparing the composite.
Provided is an electrode containing the composite.
Provided is a lithium battery including the electrode.

Additional aspects will be set forth in part in the description which follows and, in part, will be apparent from the description, or may be learned by practice of the presented embodiments.

According to an aspect, a composite includes a carbonaceous material; a plurality of silicon structures disposed on the carbonaceous material; and a graphene layer, which comprises graphene and is disposed on the plurality of silicon structures, wherein a silicon structure of the plurality of silicon structures includes silicon, and a silicon oxide of the formula $SiO_x$ which is disposed on a surface of the silicon, wherein $0<x<2$.

According to another aspect, a method of preparing a composite includes: disposing a composition including a plurality of silicon structures and a solvent on a carbonaceous material to form a coating, wherein a silicon structure of the plurality of silicon structures comprises silicon, and a silicon oxide of the formula $SiO_x$ which is disposed on a surface of the silicon, wherein $0<x<2$; drying the coating to obtain a precursor structure, which comprises the carbonaceous material and the plurality of silicon structures coated on the carbonaceous material; contacting the precursor structure with a carbonaceous source gas; and heat-treating carbonaceous source gas and the precursor structure to prepare the composite, wherein the composite includes a carbonaceous material, a plurality of silicon structures disposed on the carbonaceous material; and a graphene layer, which includes graphene and is disposed on the plurality of silicon structures, wherein a silicon structure of the plurality of silicon structures includes silicon, and a silicon oxide of the formula $SiO_x$ which is disposed on a surface of the silicon, wherein $0<x<2$.

An electrode includes the composite.

An electrode includes: a carbonaceous material; a plurality of silicon structures disposed on the carbonaceous material; and a graphene layer, which comprises graphene and is disposed on the plurality of silicon structures, wherein a silicon structure of the plurality of silicon structures comprises a composite comprising silicon, and a silicon oxide of the formula $SiO_x$, wherein $0<x<2$, disposed on a surface of the silicon.

A lithium battery includes the electrode.

BRIEF DESCRIPTION OF THE DRAWINGS

These and/or other aspects will become apparent and more readily appreciated from the following description of the embodiments, taken in conjunction with the accompanying drawings in which:

FIGS. 6A to 6C show the results of transmission electron microscope (TEM) analysis performed on a composite prepared in Example 2, in which FIG. 6C is an enlarged view of the indicated region of FIG. 6B;

DETAILED DESCRIPTION

Figure 1A:
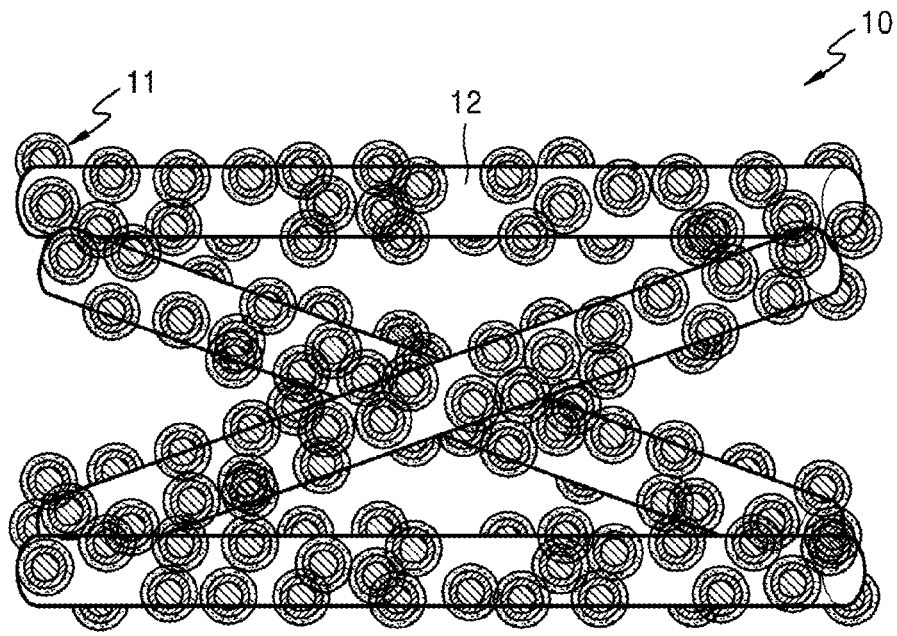
FIG. 1A is a schematic view of a structure of a composite according to an exemplary embodiment.

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. "Or" means "and/or." Expressions such as "at least one of," when preceding a list of elements, modify the entire list of elements and do not modify the individual elements of the list.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

AC rate means a current which will discharge a battery in one hour, e.g., a C rate for a battery having a discharge capacity of 1.6 ampere-hours would be 1.6 amperes.

According to an exemplary embodiment, provided is a composite including a carbon-based material, i.e., a carbonaceous material, a plurality of silicon structures disposed on, e.g., coated on, the carbon-based material; and a graphene layer, which comprises graphene and is disposed on the plurality of silicon structures, wherein a silicon structure of the plurality of selected structures comprises silicon and a silicon oxide of the formula $SiO_x$, wherein $0<x<2$ and disposed on a surface of the silicon. In an embodiment, each silicon structure of the plurality of silicon structures comprises silica and the silicon oxide.

The silicon structures are anchored to the carbon-based material by disposing the graphene layer between at least a part of the silicon oxide and the carbon-based material. Also, the plurality of silicon structures are connected by the graphene layer.

When silicon is used as an electrode active material, silicon is electrically disconnected from a current collector due to volume expansion of silicon during charging/discharging of a battery, and thus a capacity of the battery may decrease in a short period of time. Also, as the charging/discharging of the battery repeats, a side reaction with an electrolyte solution occurs on a new surface generated by pulverization of the silicon, and thus an amount of lithium available decreases in a short period of time, which then rapidly deteriorates the performance of the battery. In order to resolve such problems, a method for using a binder in the preparation of an electrode to anchor silicon in the electrode has been suggested. According to the method, when a large amount of a binder is used, an electrode containing silicon may have a low conductivity and a low energy density.

In this regard, as a result of studies conducted by the present inventors, provided is a composite that suppresses dropout, e.g., delamination, of silicon, and blocks volume expansion of silicon having a high capacity during a battery reaction. Further, in the disclosed composite the silicon structures are anchored to a carbon-based material without using an insulating binder. The composite has graphene as a protection layer. While not wanting to be bound by theory, it is understood that the graphene blocks a side reaction between the silicon structures and an electrolyte solution. The graphene can be directly grown on the carbon-based material and the silicon structures coated on the carbon-based material by gaseous carbon deposition. The composite prepared by the disclosed preparation process provides improved capacity and conductivity without using a separate binder or conducting agent, unlike a commercially available electrode, and thus the electrode including the composite has small dead volume in the electrode, and the electrode has a good uniformity.

The carbon-based material comprises at least one selected from a graphite fiber textile, a carbon nanotube (CNT), a carbon nanotube bundle, and a carbon fiber. The carbon-based material may comprise, for example, a textile 3-dimensional current collector containing at least one component selected from graphite and CNT. The carbon-based material may serve as a flexible carbon current collector, and thus when a composite including the carbon-based material is used, the composite may be suitable for manufacturing an electrode of a flexible battery.

The composite according to an embodiment may be a structure including carbon nanotubes, silicon structures coated on the carbon nanotubes, and graphene covering the silicon structures; and may be in the form of a bundle of the structure.

The carbon nanotubes may be twist aligned.

Figure 1B:
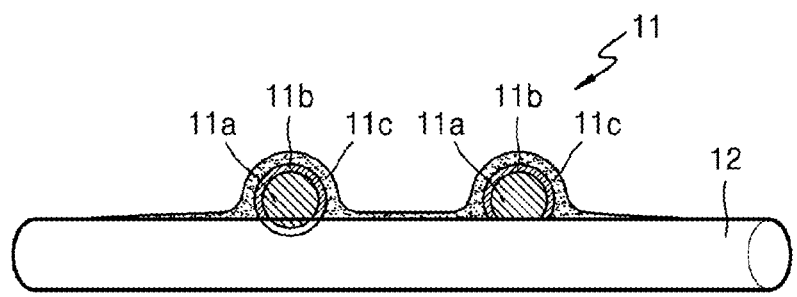
FIG. 1B shows a structure of the composite according to another exemplary embodiment.
Figure 1C:
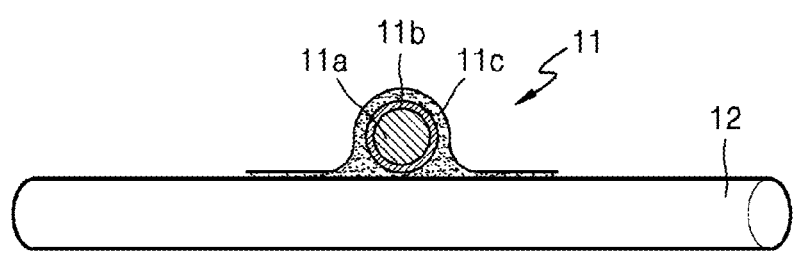
FIG. 1C illustrates a vapor-phase reaction for graphene growth in a method of preparing the composite according to an exemplary embodiment.
Figure 1D:
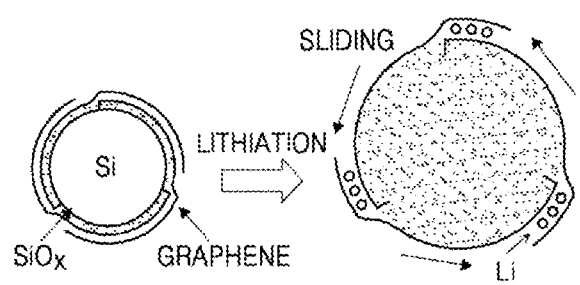
FIG. 1D illustrates a method of implementing a clamping effect as a graphene layer helps silicon particles to expand and lithium ions to diffuse during a lithiation process.

A structure of a composite 10 according to an embodiment will be further described with reference to FIGS. 1A to 1C. In FIGS. 1A to 1C, a thickness of a carbon-based material 12, a silicon oxide 11b, and the graphene layer 11c are arbitrarily illustrated for convenience of explanation, and the disclosed embodiments are not limited thereto.

Referring to FIG. 1A, the composite 10 has a structure in which the silicon structures 11 are coated on the carbon-based material 12. As shown in FIG. 1B, the silicon structures 11 includes silicon 11a and the silicon oxide 11b of the formula $SiO_x$ wherein $0<x<2$, which is disposed on a surface of the silicon 11a. In FIGS. 1A to 1C, the silicon 11a is shown as in the form of particle, but the form of the silicon 11a is not limited thereto, and may have any suitable form. For example, the silicon may be in the form of platelet, a rod, or a needle, for example.

As shown in FIGS. 1B and 1C, each of the silicon structures 11 includes the silicon oxide 11b and the graphene layer 11c covering the carbon-based material 12. Also, as shown in FIG. 1B, the plurality of silicon structures 11 may be connected by the graphene layer 11c. In this regard, since the silicon structures 11 are connected by the graphene layer 11c, dropout, e.g., delamination, of silicon from an electrode current collector may be prevented without using a binder in a battery including an electrode that includes the composite 10 when the battery is repeatedly charged/discharged. Also, as shown in FIG. 1C, the graphene layer 11c may be disposed between at least a part of the silicon structures 11 and the carbon-based material 12. In this regard, the silicon structures 11 and the carbon-based material 12 are anchored by the graphene layer 11c, and thus a structural collapse due to volume expansion and pulverization of the silicon may be suppressed without using a binder. When an electrode and a lithium battery include the composite 10 having the disclosed structure, the electrode and lithium battery may have improved flexibility and conductivity as well as improved capacity characteristics.

In the composite, an amount of the silicon structures may be in a range of about 1 part to about 98 parts by weight, 2 parts to about 40 parts by weight, or, for example, about 1 part to about 20 parts by weight, based on 100 parts by weight of the composite. When the amount of the silicon structures is within this range, volume expansion of the composite contained in the electrode in the lithium battery may be reduced, and a lifespan of the lithium battery may increase. Here, the total weight of the composite denotes the total weight of the carbon-based material, the silicon structures, and the graphene.

In the composite according to an embodiment, the total amount of the graphene layer and the carbon-based material may be in a range of about 1 part to about 99 parts by weight, 80 parts to about 95 parts by weight or, for example, about 70 parts to about 99 parts by weight, based on 100 parts by weight of the composite.

In the composite according to an embodiment, an amount of the graphene layer may be in a range of about 1 part to about 30 parts by weight, about 2 parts to about 25 parts by weight or, for example, about 5 parts to about 20 parts by weight, based on 100 parts by weight of the silicon structures 11. When the amount of the graphene layer is within this range, the silicon structures may suppress volume expansion and reduce pulverization and may have improved conductivity characteristics.

The graphene layer may comprise about 1 to about 15 layers of graphene, about 2 to about 10 layers of graphene, or about 3 to about 8 layers of graphene. An embodiment in which the graphene layer consists of a single layer graphene is specifically mentioned.

In the composite 10 according to an embodiment, an amount of the carbon-based material may be in a range of about 300 parts to about 2000 parts by weight, or, for example, about 350 parts to about 1900 parts by weight, or about 390 parts to about 1880 parts by weight, based on 100 parts by weight of the silicon structures. When the amount of the carbon-based material is within this range, the composite may have improved capacity and conductivity. When the amount of the carbon-based material is within this range, the silicon structures may be suitably anchored to the carbon-based material, and flexibility of the electrode including the composite may be satisfactory. In the silicon structure, the silicon oxide of the formula $SiO_x$, wherein $0<x<2$, is used as a seed layer for forming the graphene of the graphene layer, instead of removing the silicon oxide, which is a natural oxide formed on the silicon. A shape, a structure, and a thickness of the graphene may be controlled when the graphene on the silicon is formed by using the silicon oxide. The silicon oxide ($SiO_x$, wherein $0<x<2$), is an unstable material which lacks oxygen, as compared to silica (i.e., $SiO_2$), and has a tendency to form a stable material by reacting with another reactive material, such as carbonaceous source gas. By using such tendency of the silicon oxide, the silicon oxide ($SiO_x$, wherein $0<x<2$) may be used as a seed layer for forming graphene. A thickness of the silicon oxide ($SiO_x$, wherein $0<x<2$) formed on the silicon significantly affects a shape and/or a structure of the graphene.

A thickness of the silicon oxide ($SiO_x$, where $0<x<2$) may be selected in a manufacturing process used in the formation of graphene, for example, by changing a composition of a carbonaceous source gas suitable for the formation of graphene. A thickness of the silicon oxide ($SiO_x$, wherein $0<x<2$) may be 300 micrometers (μm) or less.

According to an embodiment, a thickness of the silicon oxide ($SiO_x$, where $0<x<2$) in the composite used in a battery may be 10 nanometers (nm) or less, for example, in a range of 0.1 nm to 10 nm, or 0.1 nm to 5 nm. When the thickness of the composite is within this range, capacity characteristics of the battery may be improved.

In the composite according to an embodiment, the graphene has a 2D peak that is observed in a range of about 2600 $cm^{-1}$ to about 2800 $cm^{-1}$ in a Raman Spectrum of the graphene. A D/G intensity ratio obtained from analyzing the Raman Spectrum of the graphene may be in 2 or less, for example, a range of 1.1 to about 2.

Hereinafter, a method of preparing the composite is further disclosed.

First, a silicon structure is dispersed in a solvent. The solvent may comprise a C1 to C6 alcohol, a C1 to C6 ether, or a combination thereof. Examples of the solvent may include isopropyl, alcohol, methanol, ethanol, butanol, and tetrahydrofuran. When the solvent is an alcohol-based solvent, such as isopropyl alcohol, ethanol, or butanol, a dispersibility of the silicon structure in the solvent may be better than those in other solvents. An amount of the solvent may be, for example, in a range of about 100 parts to about 4000 parts by weight, based on 100 parts by weight of the silicon structure.

As is further described above, the silicon structure dispersed in the solvent is disposed on, e.g., coated and dried on a carbon-based material to obtain a carbon-based material/silicon precursor structure including the carbon-based material and the silicon structure coated on the carbon-based material. Here, a method of coating the silicon structure is not particularly limited, and the silicon structure may be coated on the carbon-based material by wet dipping or slurry coating, for example.

The drying process may be performed at any suitable temperature, for example, in a range of about 25° C. to about 60° C. When the temperature is within this range, the silicon structure may be evenly coated on the carbon-based material.

Subsequently, a process of forming graphene on the silicon structure of the carbon-based material/silicon precursor structure is performed by gaseous carbon deposition that does not use a catalyst.

The gaseous carbon deposition is performed by heat-treating silicon that is covered with a silicon oxide ($SiO_x$) in a gas atmosphere, wherein the gas comprises at least one selected from a compound represented by Formula 1, a compound represented by Formula 2, and an oxygen-containing gas represented by Formula 3. An embodiment in which the gas consists of at least one selected from a compound represented by Formula 1, a compound represented by Formula 2, and an oxygen-containing gas represented by Formula 3 is mentioned.

$$C_nH_{(2n+2-a)}(OH)_a \quad \text{Formula 1}$$

In Formula 1, n is an integer of 1 to 20, and a is an integer of 0 or 1.

$$C_nH_{2n} \quad \text{Formula 2}$$

In Formula 2, n is an integer of 2 to 6.

$$C_xH_yO_z \quad \text{Formula 3}$$

In Formula 3, x is 0 or an integer of 1 to 20, y is 0 or an integer of 1 to 20, and z is an integer of 1 or 2.

The gaseous carbon deposition is not limited to the methods that are disclosed herein. The coating formed by the gaseous carbon deposition may be provided using any suitable method, and is related to reforming of silicon covered with the silicon oxide ($SiO_x$) using $CO_2$.

According to the gaseous carbon deposition, graphene is grown directly on silicon, and thus the silicon and the graphene are highly adhered to each other.

According to another embodiment, even when an $SiO_x$ layer is not present on the silicon, an $SiO_x$ layer may be first formed on the silicon by contacting the silicon with an oxygen-containing gas to react the silicon with the oxygen-containing gas after a reaction between a carbon gas mixture and an oxygen gas mixture, and then graphene may be formed thereon by reaction with the carbon gas mixture.

The adherency between the silicon and the graphene may be evaluated by using a distance between the silicon and the graphene as determined with a scanning electron microscope (SEM). The graphene extends to a distance of about 10 nm or less, for example, about 0.5 nm to about 10 nm, from the silicon. In some embodiments, the graphene extends to a distance of about 1 nm or less, for example, about 0.5 nm to about 1 nm, from the silicon. Also, the graphene may be oriented at an angle in a range of about 0° to about 90°, about 5° to about 30°, or about 60° to about 85° with respect to a primary axis of the silicon. The graphene may comprise about 1 to about 20 layers of graphene, e.g., about 2 to about 15 layers, and the total thickness of the graphene layer may be in a range of about 0.6 nm to about 12 nm. An embodiment in which the graphene layer consists of a single layer of carbon is mentioned. A shape of the silicon is not limited, and may be rectilinear and/or curvilinear, and may be for example, at least one selected from nanowires, particles, nanotubes, nanorods, wafers, and nanoribbons.

In an embodiment, the silicon may have a shape of nanowire. Here, a cross-sectional length of a silicon nanowire may be about 500 nm or less, for example, from about 100 nm to about 300 nm. Alternatively, a diameter of the nanowire may be about 50 nm or more, for example from about 50 nm to about 100 nm.

In an embodiment, a silicon oxide ($SiO_x$, wherein $0<x<2$) layer is formed on the silicon nanowires, and the graphene may be formed thereon.

In some embodiments, a silicon oxide ($SiO_x$, wherein $0<x<2$) layer is formed on silicon nanoparticles, and the graphene may be formed thereon. Here, an average particle diameter of the silicon nanoparticles may be from about 40 nm to about 40 μm, or about 40 nm to about 100 nm.

When the silicon is a wafer type, a thickness of the silicon wafer may be 2 mm or less, for example, about 0.001 mm to about 2 mm.

Graphene is a polycyclic aromatic molecule comprising a plurality of carbon atoms that are covalently bonded to one another, and the covalently bonded plurality of carbon atoms form a 6-membered ring as a basic repeating unit, and a 5-membered ring and/or a 7-membered ring may be included in the graphene. As a result, the graphene may appear as a single layer of the covalently bonded carbon atoms (in general, having a $sp^2$ bond). The graphene layer may include a single layer or multiple layers, for example, 1 layer to about 100 layers, for example, about 2 layers to about 100 layers, or about 3 layers to about 50 layers of graphene that are stacked on each other.

The graphene layer may be in the form of a nanosheet or a film (or, a layer).

The term "nanosheet" and "layer" used herein are defined as follows.

The term "nanosheet" denotes a structure having an irregular form, and the term "layer" denotes a film that is continuously and uniformly formed on a silicon oxide surface.

The composite may further include a metal oxide. In this regard, when a metal oxide is further included in the composite, formation of a SEI layer may be prevented due to suppression of side reaction.

The metal oxide may comprise at least one selected from the group consisting of magnesium oxide, manganese oxide, aluminum oxide, titanium oxide, zirconium oxide, tantalum oxide, tin oxide, and hafnium oxide.

In the composite according to an embodiment, the graphene may serve as an SEI stabilization clamping layer. Also, the composite has a high specific surface area, and thus when a battery includes the composite, deterioration of an initial efficiency and a volume energy density may be prevented.

While not wanting to be bound by theory, it is understood that the graphene may suppress disintegration or pulverization of an active material, such as silicon, and may improve conductivity of the composite.

The process for forming the graphene layer on the silicon structures coated on the carbon-based material may include contacting a carbonaceous source gas and the silicon structures, e.g., supplying and heat-treating a carbonaceous source gas to the silicon structures.

The carbonaceous source gas may comprise at least one compound selected from the compound represented by Formula 1, the compound represented by Formula 2, and the oxygen-containing gas represented by Formula 3.

The compound represented by Formula 1 and the compound represented by Formula 2 can be at least one selected from methane, ethylene, propylene, methanol, ethanol, and propanol.

The oxygen-containing gas represented by Formula 3 may include, for example, at least one selected from carbon dioxide ($CO_2$), carbon monoxide (CO), and water ($H_2O$). The oxygen-containing gas represented by Formula 3 may further include an inert gas that is at least one selected from nitrogen, helium, and argon, in addition to the carbonaceous source gas. The oxygen-containing gas may be at least one selected from the group consisting of carbon monoxide, carbon dioxide, and water vapor.

When the carbon source gas is the oxygen-containing gas, a thickness of the silicon oxide layer may be thicker than a natural silicon oxide layer. For example, a thickness of the silicon oxide layer may be selected to be about 10 nm or less, for example, from about 0.5 nm to about 5 nm. When a thickness of the silicon oxide is within the range above, a shape and a thickness of the graphene may be suitable. In particular, when a thickness of the silicon oxide layer is formed thicker than a thickness of a natural oxide layer, a graphene layer having a compact structure, as compared to a graphene nanosheet formed on the silicon oxide layer, may be obtained. Here, the graphene layer has, for example, a 5- or 10-layered structure.

When the gas mixture includes water vapor, the composite obtained as a result may have a greater conductivity than that of the case when water vapor is not included. Although not wanting to be limited to a particular theory, it is understood that carbon with a high degree of crystallinity is deposited on the silicon covered with a silicon oxide by the reaction of the gas mixture in the presence of water vapor, and thus the composite may have a high conductivity even when the silicon is coated with a small amount of carbon. A content of water vapor in the gas mixture may be, for example, from about 0.01 volume percent (vol %) to about 10 vol %, or about 0.1 vol % to about 5 vol %, based on 100 vol % of the carbonaceous source gas, but embodiments are not limited thereto.

The carbonaceous source gas may comprise, for example, at least one selected from methane, a gas mixture including methane and an inert gas, an oxygen-containing gas, and a gas mixture including methane and an oxygen-containing gas.

In an embodiment, the carbon source gas may be a gas mixture of $CH_4$ and $CO_2$, or a gas mixture of $CH_4$. The gas mixture of $CH_4$ and $CO_2$ may be provided at a molar ratio of about 1:0.20 to 0.50, for example, about 1:0.25 to 0.45, or, for example, about 1:0.30 to 0.40, for $CH_4:CO_2$.

In some embodiments, the carbonaceous source gas may comprise methane or a gas mixture of methane and carbon dioxide. For example, the gas mixture of methane and carbon dioxide may have a volume ratio of 1:1 for methane and carbon dioxide.

Figure 1E:
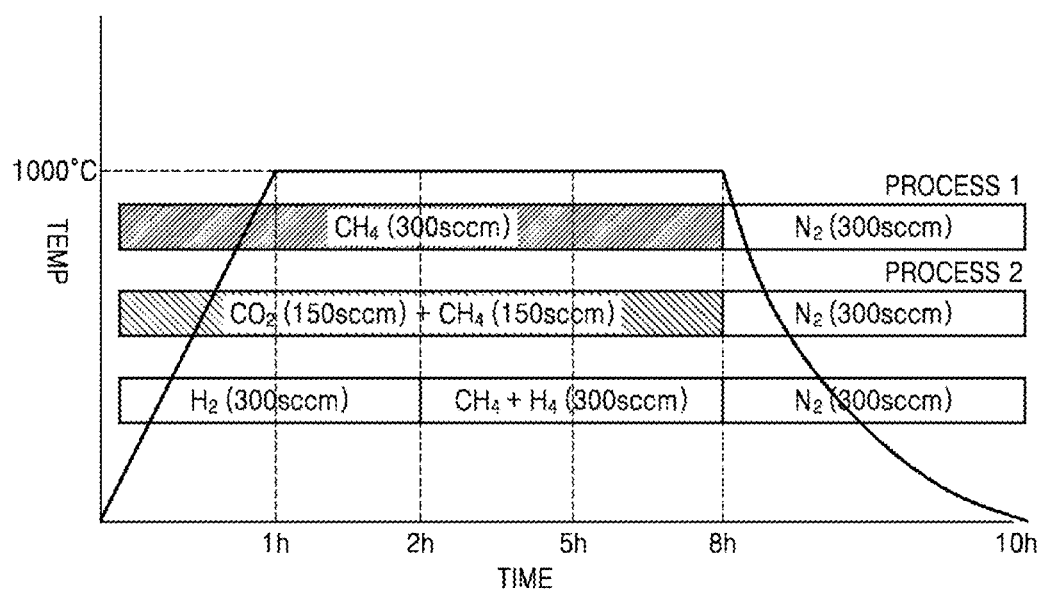
FIG. 1E is a graph of temperature (° C.) versus time which illustrates an embodiment of a heat treating process to form graphene.

The heat-treating of the structure may be performed at a temperature in a range of about 700° C. to about 1100° C., for example, in a range of about 800° C. to about 950° C. A graph illustrating the heat treating process is shown in FIG. 1E.

In the heat-treating, a pressure is not limited and may be selected in consideration of a heat-treating temperature, a composition of a gas mixture, and a desired amount of carbon coating. The pressure for the heat-treating may be selected by changing an amount of supply and discharge of the gas mixture from the reactor. For example, the pressure for the heat-treating may be about 1 atmosphere (atm) or higher, for example, about 2 atm or higher, about 3 atm or higher, about 4 atm or higher, or, for example, about 5 atm or higher, but embodiments are not limited thereto, and may be about 1 atm to about 50 atm.

A heat-treating time is not particularly limited and may be appropriately selected depending on a heat-treating temperature, a heat-treating pressure, a composition of a gas mixture, and a desired amount of carbon coating. For example, the reaction time may be in a range of about 10 minutes to about 100 hours, for example, in a range of about 30 minutes to about 90 hours, for example, in a range of about 50 minutes to about 40 hours, but embodiments are not limited thereto. Although not wanting to be limited to a particular theory, since an amount of graphene (carbon) being deposited increases as time passes, electrical properties of the composite may be improved accordingly. However, such tendency is not always in direct proportion to time. For example, no further graphene deposition may occur or a deposition rate of the graphene may decrease after a selected period of time.

The method of manufacturing the composite may provide a uniform coating of graphene on the silicon structure even at a relatively low temperature although a gas phase reaction of the carbonaceous source gas may occur. Also, dropout, e.g., delamination, of the graphene formed on the silicon covered with the silicon oxide ($SiO_x$) layer does not substantially occur. When a thickness of the silicon oxide layer is suitable, dropout of the graphene may be even further suppressed. In this regard, a thickness of the silicon oxide layer that may efficiently suppress delamination of the graphene is about 10 nm or less, for example, from about 0.1 nm to about 10 nm, for example, from about 0.1 nm to about 5 nm.

Also, since the graphene is coated on the silicon through the gas phase reaction, a coating layer with a high degree of crystallinity may be formed, and thus when the composite is used as a negative electrode active material, the conductivity of the negative electrode active material may increase without changing a structure of the composite.

The composite according to an embodiment may be used in a lithium battery, an illuminant for display, a thermoelectric device, or a biosensor.

According to another aspect, an electrode including the composite is provided. The electrode may be an electrode for a lithium battery. Here, the electrode may be a negative electrode.

The composite may be used as a negative electrode without using a binder, e.g., a polymeric binder such as polyvinylidene fluoride (PVDF), and a conducting agent, e.g., carbon black.

The lithium battery according to an embodiment includes the negative electrode and may be manufactured by using the method described as follows.

In the manufacturing process of the lithium battery, a positive electrode active material may include at least one selected from the group consisting of lithium cobalt oxide, lithium nickel cobalt manganese oxide, lithium nickel cobalt aluminum oxide, lithium iron phosphate oxide, and lithium manganese oxide, but the positive electrode active material is not limited thereto, and any suitable positive electrode active material available in the art may be used.

For example, the positive electrode active material may be a compound represented by any of following formulas: $Li_aA_{1-b}R_bD_2$ (where, $0.90 \leq a \leq 1.8$, and $0 \leq b \leq 0.5$); $Li_aE_{1-b}R_bO_{2-c}D_c$ (where, $0.90 \leq a \leq 1.8$, $0 \leq b \leq 0.5$, and $0 \leq c \leq 0.05$); $LiE_{2-b}R_bO_{4-c}D_c$ (where, $0 \leq b \leq 0.5$ and $0 \leq c \leq 0.05$); $Li_aNi_{1-b-c}Co_bR_cD_\alpha$ (where, $0.90 \leq a \leq 1.8$, $0 \leq b \leq 0.5$, $0 \leq c \leq 0.05$, and $0 < \alpha \leq 2$); $Li_aNi_{1-b-c}Co_bR_cO_{2-\alpha}X_\alpha$ (where, $0.90 \leq a \leq 1.8$, $0 \leq b \leq 0.5$, $0 \leq c \leq 0.05$, and $0 < \alpha < 2$); $Li_aNi_{1-b-c}Co_bR_cO_{2-\alpha}X_2$ (where, $0.90 \leq a \leq 1.8$, $0 \leq b \leq 0.5$, $0 \leq c \leq 0.05$, and $0 < \alpha < 2$); $Li_aNi_{1-b-c}Mn_bR_cD_\alpha$ (where, $0.90 \leq a \leq 1.8$, $0 \leq b \leq 0.5$, $0 \leq c \leq 0.05$, and $0 < \alpha \leq 2$); $Li_aNi_{1-b-c}Mn_bR_cO_{2-\alpha}X_\alpha$ (where, $0.90 \leq a \leq 1.8$, $0 \leq b \leq 0.5$, $0 \leq c \leq 0.05$, and $0 < \alpha < 2$); $Li_aNi_{1-b-c}Mn_bR_cO_{2-\alpha}X_2$ (where, $0.90 \leq a \leq 1.8$, $0 \leq b \leq 0.5$, $0 \leq c \leq 0.05$, and $0 < \alpha < 2$); $Li_aNi_bE_cG_dO_2$ (where, $0.90 \leq a \leq 1.8$, $0 \leq b \leq 0.9$, $0 \leq c \leq 0.5$, and $0.001 \leq d \leq 0.1$); $Li_aNi_bCo_cMn_dGeO_2$ (where, $0.90 \leq a \leq 1.8$, $0 \leq b \leq 0.9$, $0 \leq c \leq 0.5$, $0 \leq d \leq 0.5$, and $0.001 \leq e \leq 0.1$); $Li_aNiG_bO_2$ (where, $0.90 \leq a \leq 1.8$ and $0.001 \leq b \leq 0.1$); $Li_aCoG_bO_2$ (where, $0.90 \leq a \leq 1.8$ and $0.001 \leq b \leq 0.1$); $Li_aMnG_bO_2$ (where, $0.90 \leq a \leq 1.8$ and $0.001 \leq b \leq 0.1$); $Li_aMn_2G_bO_4$ (where, $0.90 \leq a \leq 1.8$ and $0.001 \leq b \leq 0.1$); $QO_2$; $QS_2$; $LiQS_2$; $V_2O_5$; $LiV_2O_5$; $LiM'O_2$; $LiNiVO_4$; $Li_{(3-f)}J_2(PO_4)_3$ ($0 \leq f \leq 2$); $Li_{(3-f)}Fe_2(PO_4)_3$ ($0 \leq f \leq 2$); and $LiFePO_4$.

In the formulas, A is Ni, Co, Mn, or a combination thereof; R is Al, Ni, Co, Mn, Cr, Fe, Mg, Sr, V, a rare earth element, or a combination thereof; D is O, F, S, P, or a combination thereof; E is Co, Mn, or a combination thereof; X is F, S, P, or a combination thereof; G is Al, Cr, Mn, Fe, Mg, La, Ce, Sr, V, or a combination thereof; Q is Ti, Mo, Mn, or a combination thereof; M' is Cr, V, Fe, Sc, Y, or a combination thereof; and J is V, Cr, Mn, Co, Ni, Cu, or a combination thereof.

The compound may have a coating layer on a surface thereof or the compound may be combined with a compound having a coating layer. The coating layer may include a coating element compound of an oxide or a hydroxide of a coating element, an oxyhydroxide of a coating element, an oxycarbonate of a coating element, or a hydroxycarbonate of a coating element. The compound forming the coating layer may be amorphous or crystalline. The coating element included in the coating layer may be at least one selected from Mg, Al, Co, K, Na, Ca, Si, Ti, V, Sn, Ge, Ga, B, As, and Zr. A process of forming the coating layer may be any suitable coating method capable of coating the compound by using the elements in a manner that does not negatively affect desirable physical properties of the positive electrode active material (e.g., spray coating or immersion), and since the details of the coating process is determined by those of skill in the art without undue experimentation, additional detailed description of the coating process is omitted.

For example, the compound may be at least one selected from $LiNiO_2$, $LiCoO_2$, $LiMn_xO_{2x}$ (wherein x is 1 or 2), $LiNi_{1-x}Mn_xO_2$ (wherein $0 < x < 1$), $LiNi_{1-x-y}Co_xMn_yO_2$ (wherein $0 \leq x \leq 0.5$ and $0 \leq y \leq 0.5$), $LiFeO_2$, $V_2O_5$, TiS, and MoS.

Examples of the conducting agent may include acetylene black, KETJEN black, natural graphite, artificial graphite, carbon black, carbon fibers, and a metal powder of copper, nickel, aluminum, or silver. The conducting agent may be a conductive material of one type, such as, a polyphenylene derivative, or a mixture of at least two types of conductive materials, but the conducting agent is not limited thereto, and any suitable conducting agent available in the art may be used.

Examples of the binder may include a vinylidene fluoride/hexafluoropropylene copolymer, polyvinylidenefluoride (PVDF), polyacrylonitrile, polymethylmethacrylate, polytetrafluoroethylene, a mixture thereof, a styrene-butadiene rubber-based polymer, polyacrylic acid, polyamidimide, or polyimide, but the binder is not limited thereto, and any suitable binder available in the art may be used.

The solvent may be at least one selected from N-methylpyrrolidone, acetone, and water, but the solvent is not limited thereto, and any suitable solvent may be used.

Contents of the positive electrode active material, the conducting agent, the binder, and the solvent are at levels which may be determined by those of skill in the art without undue experimentation. At least one of the conducting agent, the binder, and the solvent may be omitted if desired depending on use and configuration of a lithium battery.

Next, a separator to be inserted between the positive electrode and the negative electrode is provided. The separator may be any separator suitable for a lithium battery. The separator may have a low resistance with respect to ion movement and an excellent electrolyte containing ability. For example, the separator may comprise at least one selected from glass fibers, polyester, Teflon, polyethylene, polypropylene, and polytetrafluoroethylene. The separator may be a non-woven type or a woven type. For example, a rollable separator, such as polyethylene or polypropylene, is used in a lithium ion battery, and a separator having an excellent organic electrolyte containing ability may be used in a lithium ion polymer battery. For example, the separator may be manufactured by using the following method.

A separator composition is prepared by mixing a polymer resin, a filler, and a solvent. A separator may be formed as the separator composition is directly coated and dried on an electrode. Alternatively, the separator composition may be cased and dried on a support, and a film detached from the support may be laminated on an electrode to prepare the separator.

The polymer resin used in the preparation of the separator is not particularly limited, and any suitable material used as a binder for electrode plates may be used. For example, the polymer resin may be at least one selected from a vinylidenefluoride/hexafluoropropylene copolymer, polyvinylidenefluoride (PVDF), polyacrylonitrile, and polymethylmethacrylate.

The separator may include a ceramic composition to improve function of the separator as a membrane. For example, the separator may be coated by an oxide or include ceramic particles.

Next, an electrolyte is prepared.

For example, the electrolyte may be an organic electrolyte. Also, the electrolyte may be a solid. For example, the electrolyte may comprise boron oxide or lithium oxynitride, but is not limited thereto, and any suitable solid electrolyte available in the art may be used. The solid electrolyte may be formed on the negative electrode by using a method, such as, sputtering.

For example, an organic electrolyte may be prepared. The organic electrolyte may be prepared by dissolving a lithium salt in an organic solvent.

The organic solvent may be any suitable organic solvent available in the art. For example, the organic solvent may be at least one selected from propylenecarbonate, ethylenecarbonate, fluoroethylencarbonate, butylenecarbonate, dimethylcarbonate, diethylcarbonate, methylethylcarbonate, methylpropylcarbonate, ethylpropylcarbonate, methylisopropylcarbonate, dipropylcarbonate, dibutylcarbonate, fluoroethylenecarbonate, benzonitrile, acetonitrile, tetrahydrofuran, 2-methyltetrahyerofuran, γ-butylolactone, dioxolane, 4-methyldioxolane, N,N-dimethylformamide, N,N-dimethylacetamide, N,N-dimethylsulfoxide, dioxane, 1,2-dimethyoxyethane, sulfolane, dichloroethane, chlorobenzene, nitrobenzene, diethyleneglycol, and dimethylether.

The lithium salt may be any suitable lithium salt available in the art. For example, the lithium salt may be at least one selected from $LiPF_6$, $LiBF_4$, $LiSbF_6$, $LiAsF_6$, $LiClO_4$, $LiCF_3SO_3$, $Li(CF_3SO_2)_2N$, $LiC_4F_9SO_3$, $LiAlO_2$, $LiAlCl_4$, $LiN(C_xF_{2x+1}SO_2)(C_yF_{2y+1}SO_2)$ (wherein x and y are a natural number), LiCl, and LiI.

Figure 2A:
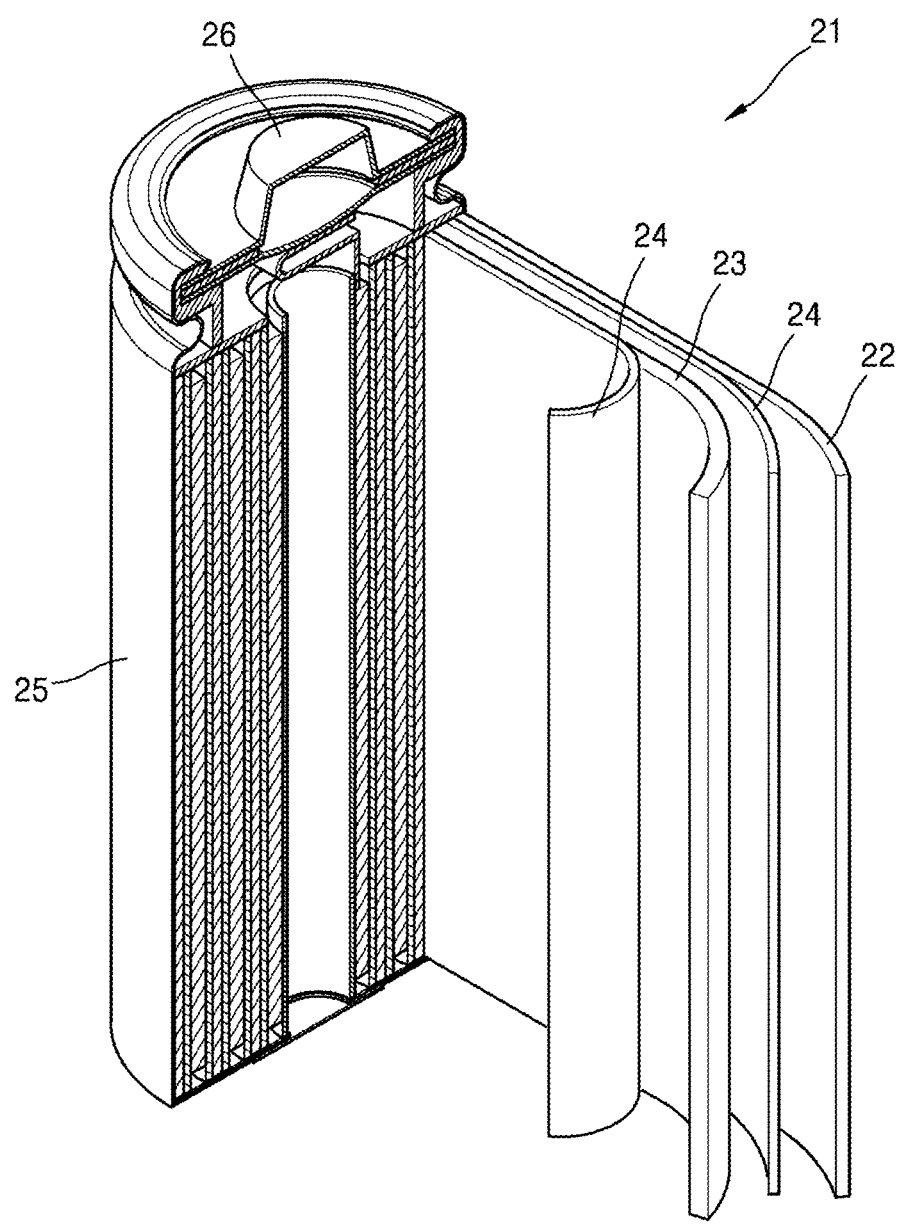
FIG. 2A is a schematic view of an embodiment of a lithium battery.

As shown in FIG. 2A, a lithium battery 21 includes a positive electrode 23, a negative electrode 22, and a separator 24. The positive electrode 23, negative electrode 22, and separator 24 are wound or folded and accommodated in a battery case 25. Then, an organic electrolyte is injected into the battery case 25, and the battery case 25 is sealed with a cap assembly 26, thereby completing the manufacture of the lithium battery 21. The battery case 25 may have a shape of a cylinder, a box, or a thin film. For example, the lithium battery 21 may be a thin film-type battery. The lithium battery 21 may be a lithium ion battery.

The separator 24 may be disposed between the positive electrode 23 and the negative electrode 22 to form a battery structure. The battery structures may be stacked in a by-cell structure and immersed in an organic electrolyte, and the resultant is accommodated in a pouch and sealed therein, thereby completing the manufacture of a lithium ion polymer battery.

Also, a plurality of the battery structures may be stacked and form a battery pack, and the battery pack may be used in any device requiring a high capacity and a high output. For example, the battery pack may be used in a laptop, a smartphone, or an electric vehicle.

The lithium battery 21 has improved high rate capability and life characteristics and thus may be used in an electric vehicle (EV). For example, the lithium battery may be used in a hybrid vehicle, such as, a plug-in hybrid electric vehicle (PHEV).

In another aspect, an electroluminescent device contains the composite.

The electroluminescent device is a device using movement of electrons. The electroluminescent device can comprise at least one of a cathode, an emitter tip, and an anode distanced apart from the cathode (see U.S. Pat. Nos. 7,009,331, 6,976,897, and 6,911,767, and US Patent Publication No. 2006/0066217, the contents of each of which is included herein by reference in their entirety). In the electroluminescent device, electrons are emitted when a voltage is applied between the cathode and the anode. The electrons move in a direction from the cathode to the anode. The electroluminescent device is not limited thereto and may be used for various purposes, such as in an ultrasound vacuum tube device (e.g., an X-ray tube), a power amplifier, an ion gun, a high-energy accelerator, a free electron laser, and an electron microscope, particularly in a flat panel display. The flat panel display may be used as an alternative for a conventional cathode tube. Thus, the flat panel display may be applied to a television and a computer monitor.

The emitter tip may be a composite according to an embodiment of the present disclosure.

The emitter tip may comprise a semiconductor such as silicon, and may comprise a metal such as molybdenum. For example, the metal emitter tip may be used in conjunction with a control voltage for the emission of the electrons at a relatively high voltage of about 100 volts (V). Also, since the emitter tip does not have uniformity, a current density between pixels is not uniform.

When the emitter tip using the composite is used, electroluminescent emitting characteristics are improved.

In another aspect, a biosensor containing a composite according to an embodiment of the present disclosure and a carbon composite including the composite and a carbon-based material is provided.

The composite according to an embodiment of the present disclosure may be used to form an electrode for the biosensor.

Figure 2B:
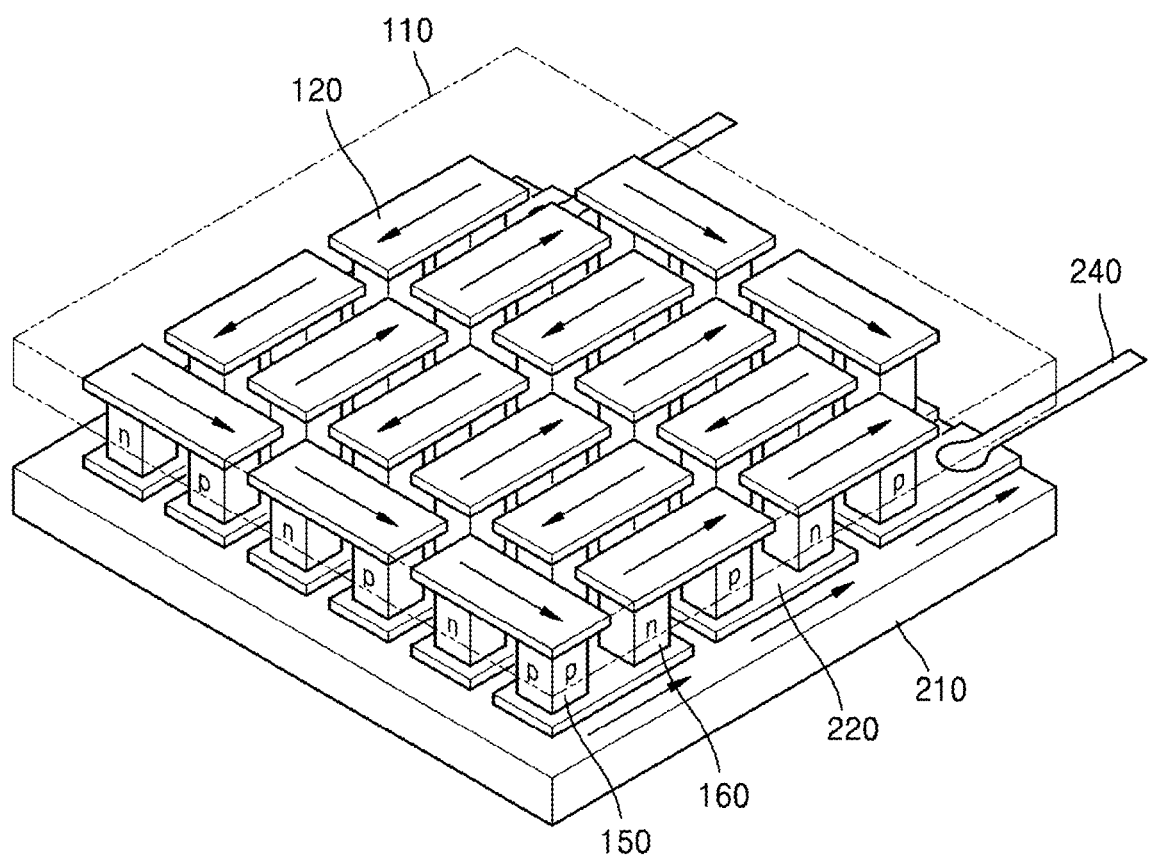
FIG. 2B is a schematic diagram of an embodiment of a thermoelectric module.
Figure 2C:
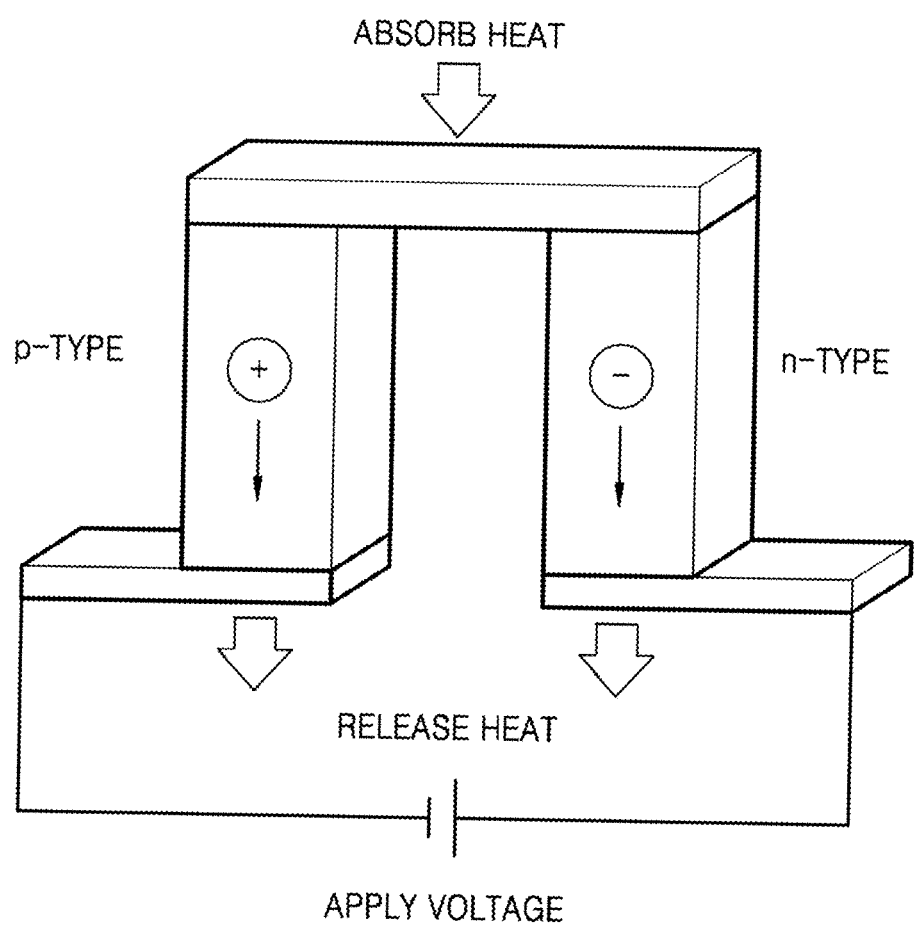
FIG. 2C is a schematic diagram illustrating an embodiment of a thermoelectric cooler that uses the Peltier effect.
Figure 2D:
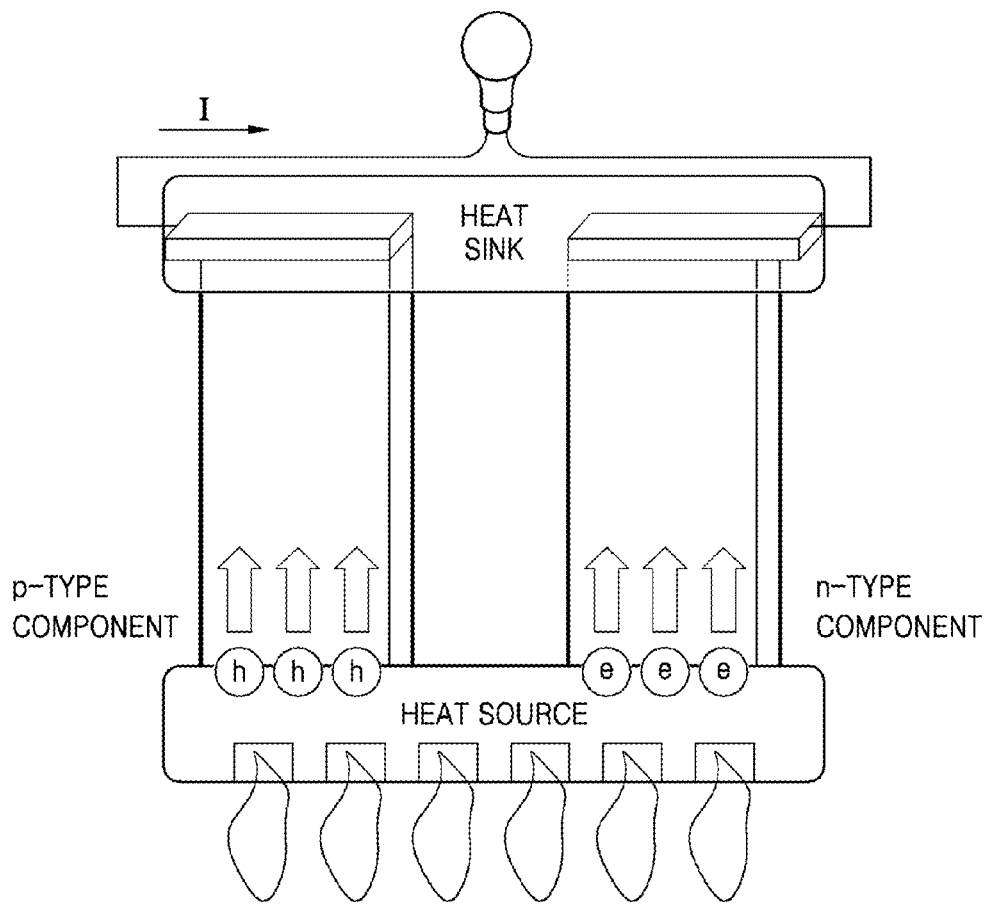
FIG. 2D is a schematic diagram illustrating an embodiment of a thermoelectric generator that uses the Seebeck effect.
Figure 2E:
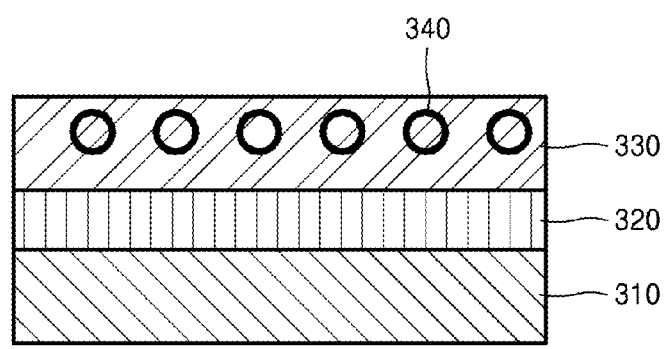
FIG. 2E illustrates a structure of an embodiment of an electrode of a biosensor.

FIG. 2E is a cross-sectional view illustrating a structure of a biosensor electrode according to an embodiment of the present disclosure. Referring to FIG. 2E, the biosensor electrode according to an embodiment of the present disclosure includes a substrate 310, a first layer 320 including a composite formed on the substrate 310, and a second layer 330 formed on the first layer 320. A biomaterial 340 is carried or fixed in the second layer 330 in various manners.

The substrate 310 denotes a plate of all types on which graphene may be deposited or formed, and, in particular, the substrate 310 may include a material selected from the group consisting of glass, plastic, metal, ceramic, and silicone, but a type of material of the substrate 310 is not limited as long as graphene may be deposited or formed thereon.

The biomaterial 340 may be selected from the group consisting of an enzyme, an aptamer, a protein, a nucleic acid, a microorganism, a cell, a lipid, a hormone, a DNA, a PNA, an RNA, and a mixture thereof. Also, the biomaterial 340 may be one of various biomaterials that are not disclosed in the present specification.

Referring to FIG. 2E, the biomaterial 340 may be a specific enzyme, and the first layer 330 discloses an electrode for a biosensor that carries the specific enzyme or uses a fixed layer. Meanwhile, in FIG. 2E, the specific enzyme is shown as carried or fixed in the layer, but a location of the specific enzyme is not limited thereto, and a part of or the whole specific enzyme may protrude from the layer. In this case, since an enzyme has an excellent substrate specificity and thus has characteristics of selectively reacting with a specific molecule in a mixture, an analysis material (e.g., blood sugar) reacting with a specific enzyme may be selectively detected.

In another aspect, a semiconductor device containing the composite is provided.

The composite may be used as an electrode of the semiconductor device.

In another aspect, a thermoelectric material containing the composite and a thermoelectric device including the thermoelectric material are provided.

The thermoelectric material has an improved thermoelectric performance due to excellent electric characteristics. The thermoelectric material may be effectively used in a thermoelectric device, a thermoelectric module, or a thermoelectric apparatus.

The performance of a thermoelectric material is defined by a dimensionless figure of merit, a ZT value of Equation 1.

$$ZT=(S^2\sigma T)/k \qquad \text{Equation 1}$$

In Equation 1, ZT is a figure of merit, S is a Seebeck coefficient, σ is an electrical conductivity, T is an absolute temperature, and k is a thermal conductivity.

As shown in Equation 1, in order to increase a ZT value of a thermoelectric material, a Seebeck coefficient and an electrical conductivity, or a power factor ($S^2\sigma$), need to be increased and a thermal conductivity needs to be decreased.

When graphene characteristics are applied to the thermoelectric material, the composite according to an embodiment of the present disclosure contains graphene, and thus electric conductivity may be high and thermal conductivity may be lowered. Thus, the performance of the thermoelectric material may be improved.

In the composite according to an embodiment of the present disclosure, crystalizibility and an electron structure at the interface between graphene having properties of a metal and a silicone having properties of a semiconductor change, and thus a Seebeck coefficient increases, and increases in an electrical conductivity and a charge mobility may be induced as transfer of charge particles is accelerated. Also, phonon scattering at the interface of the graphene and the silicone increases, and thus a thermal conductivity of the thermoelectric material may be controlled.

As described above, the composite may be effectively used as a thermoelectric material. Thus, the thermoelectric material may be molded by using a method, such as a cutting process, to manufacture a thermoelectric device. The thermoelectric device may be a p-type thermoelectric device. The thermoelectric device denotes a thermoelectric device that is modified in a predetermined shape, for example, a box shape.

Also, the thermoelectric device may include compositions that bind with an electrode and have a cooling effect due to current supply or compositions that have a power generating effect due to the difference in temperature.

FIG. 2B illustrates a thermoelectric module including the thermoelectric device. As shown in FIG. 2B, an upper electrode 212 (a first electrode) and a lower electrode2 22 (a second electrode) are patterned on an upper insulating substrate 211 and a lower insulating substrate 221. Also, a p-type thermoelectric composition 215 and an n-type thermoelectric composition 216 are in contact with the upper electrode 212 and the lower electrode 22. The electrodes 212 and 222 are connected to outside of the thermoelectric device through a lead electrode 224. The p-type thermoelectric composition 215 may be the thermoelectric device. The n-type thermoelectric composition 216 may be any n-type thermoelectric composition known in the art.

The insulating substrates 211 and 221 may comprise gallium arsenide (GaAs), sapphire, silicon, PYREX, or a quartz substrate. A material of the electrodes 212 and 222 may be variously selected from copper, aluminum, nickel, gold, and titanium, and a size of the electrodes 212 and 222 may be variously selected. A method of patterning the electrodes 212 and 222 may be any suitable known patterning method, for example, a lift off semiconductor process, a deposition method, or a photolithography method.

In an embodiment of the thermoelectric module, as shown in FIGS. 2C and 2D, one of the first electrode and the second electrode may be exposed to a heat source. In an embodiment of the thermoelectric device, one of the first electrode and the second electrode may be electrically connected to a power source or electrically connected to outside of the thermoelectric module, for example, an electric device (e.g., a battery) that consumes or stores electricity.

As an embodiment of the thermoelectric module, one of the first electrode and the second electrode may be electrically connected to a power source.

Hereinafter, the present disclosure will be described in further detail with reference to the following examples. However, these examples are for illustrative purposes only and shall not limit the scope of the present disclosure.

EXAMPLES

Example 1

As silicon structures, silicon nanoparticles (having an average particle diameter of about 150 nm, available from VD vision, Japan) having a silicon oxide ($SiO_x$, where $0<x<2$) layer (having a thickness of about 0.1 nm) formed on a surface thereof was used. 0.1 grams (g) of the silicon structures was dispersed in 200 mL of ethanol, and this was coated on graphite fiber textile (H1410, available from Freudenberg, Germany) and dried at 25° C. to coat the silicon nanoparticles having a silicon oxide ($SiO_x$, where $0<x<2$) layer (having a thickness of about 0.1 nm) formed on a surface thereof on the graphite fiber textile.

The graphite fiber textile including the silicon nanoparticles coated with a silicon oxide ($SiO_x$, where $0<x<2$) layer was disposed in a reactor. A gas mixture of $CH_4$ at a ratio of 300 standard cubic centimeters per minute (sccm) was flowed into the reactor to form an atmosphere of the gas mixture inside the reactor. A pressure formed by the flow of the gas mixture inside the reactor was 1 atmosphere (atm). Under the gas mixture atmosphere, a temperature in the reactor was increased to about 1000° C. (at a rate of rising temperature: about 23° C./min), and the gas mixture was continuously flowed into the reactor while the temperature was maintained for 3 hours to perform heat-treatment. Subsequently, the product of the heat-treatment was allowed to cool in the reactor and in the gas mixture for 4 hours. Then, the supply of the gas mixture was stopped, and the reactor was cooled to room temperature (25° C.) to obtain a composite including the graphite fiber textile, silicon nanoparticles, silicon oxide ($SiO_x$, wherein $0<x<2$) layer formed on the silicon nanoparticles, and graphene covering the silicon oxide layer and graphite fiber textile.

In the composite, a content of the graphene was about 1 part by weight based on 100 parts by weight, as the total weight, of the composite, and a content of the silicon structures (including the silicon nanoparticles and the silicon oxide layer formed thereon) was about 5 parts by weight based on 100 parts by weight of the composite.

Example 2

A composite was obtained in the same manner used in Example 1, except that a gas mixture of $CO_2$ and $CH_4$ at a flow rate ratio of 150 sccm:150 sccm ($CO_2$:$CH_4$) was used instead of the gas mixture of $CH_4$ at a ratio of 300 sccm.

A content of the graphene in the composite was about 0.5 parts by weight based on 100 parts by weight of the composite, and the total content of the silicon structures in the composite was about 5 parts by weight based on 100 parts by weight of the composite.

Example 3

A composite was obtained in the same manner used in Example 1, except that 200 mL of tetrahydrofuran was used instead of 200 mL of ethanol in the process of dispersing 0.1 g of silicon nanoparticles (an average particle diameter of about 150 nm) having a silicon oxide ($SiO_x$, where $0<x<2$) layer (having a thickness of about 0.1 nm) formed thereon in 200 mL of ethanol.

Comparative Example 1

Figure 14:
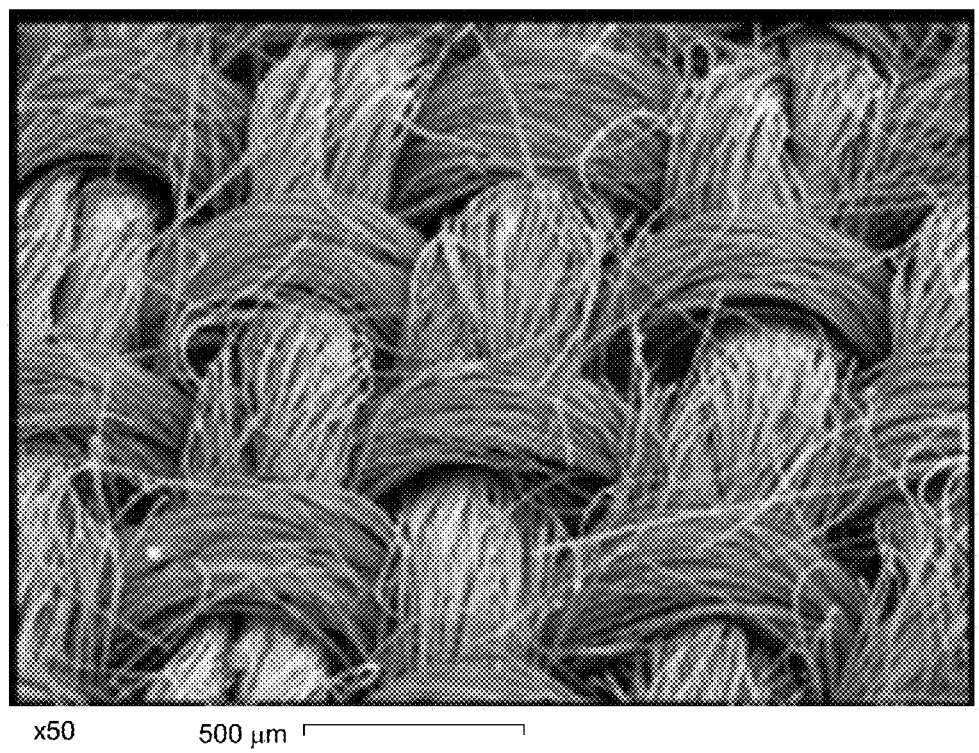
FIG. 14 is an SEM image of the graphite fiber textile, which is a carbon fiber composite, prepared in Comparative Example 1.

Graphite fiber textile (H1410, available from Freudenberg, Germany), which is a carbon fiber composite, was used (see FIG. 14).

Example 4

A coin cell (CR2032) was prepared by using the composite prepared in Example 1, as a negative electrode, and a lithium metal, as a counter electrode.

A separator was a polypropylene film (Celgard 3510), and an electrolyte was 1.3 molar (M) $LiPF_6$ including ethylene carbonate (EC), diethylene carbonate (DEC), and fluoroethylene carbonate (FEC) at a volume ratio of 2:6:2.

Examples 5 and 6

Coin cells were prepared in the same manner as in Example 4, except that the composites prepared in Examples 2 and 3 were used, respectively, instead of the composite prepared in Example 1.

Example 7

A composite was prepared in the same manner as in Example 1, except that a content of the silicon structures was changed to about 10 parts by weight due to a change in the content of the silicon nanoparticles (having an average particle diameter of about 150 nm, available from VD vision, Japan) having a silicon oxide ($SiO_x$, where $0<x<2$) layer (having a thickness of about 0.1 nm) formed on a surface thereof.

Example 8

A coin cell (CR2032) was prepared in the same manner as in Example 4, except that the composite prepared in Example 7 was used instead of the composite prepared in Example 1.

Example 9

A composite was prepared in the same manner as in Example 1, except that carbon nanotubes (CNTs) were used instead of the graphite fiber textile, and the total content of the silicon structures was changed to about 20 parts by weight based on 100 parts by weight of the composite due to a change in the content of the silicon nanoparticles (having an average particle diameter of about 150 nm, available from VD vision, Japan) having a silicon oxide ($SiO_x$, wherein $0<x<2$) layer (having a thickness of about 0.1 nm) formed on a surface thereof.

Example 10

A composite was prepared in the same manner as in Example 9, except that a gas mixture having a mixture ratio of $CO_2$:$CH_4$=150 sccm:150 sccm was used instead of a gas mixture having a ratio of $CH_4$ 300 sccm in the reactor.

In the composite, a content of the CNTs was about 78 parts by weight, graphene was about 2 parts by weight, and the silicon structures (including silicon nanoparticles and a silicon oxide layer formed thereon) was about 20 parts by weight.

Example 11

A slurry was prepared by mixing lithium-substituted polyacrylate (Li-PAA) with the composite prepared in Example 9. In the slurry, a solid content mixture ratio of the composites and the Li-PAA was 88:12 weight ratio.

The slurry was coated on a Cu foil, and then a doctor blade was used to form a layer having a thickness of about 40 μm. The layer was vacuum dried at a temperature of 120° C. for 2 hours, and then the dried product was pressed to prepare a negative electrode.

A coin cell (CR2032) was prepared by using the negative electrode and a lithium metal, as a counter electrode.

A separator was a polypropylene film (Celgard 3510), and an electrolyte was 1.3 M $LiPF_6$ including ethylene carbonate (EC), diethylene carbonate (DEC), and fluoroethylene carbonate (FEC) at a volume ratio of 2:6:2.

Example 12

A coin cell was prepared in the same manner as in Example 1, except that the composite prepared in Example 10 was used instead of the composite prepared in Example 9.

Comparative Example 2

A coin cell was prepared in the same manner as in Example 1, except that the graphite fiber textile prepared in Comparative Example 1 was used instead of the composite prepared in Example 4.

Comparative Example 3

As silicon structures, silicon nanoparticles (having an average particle diameter of about 150 nm, available from VD vision, Japan) having a silicon oxide ($SiO_x$, where $0<x<2$) layer (having a thickness of about 0.1 nm) formed on a surface thereof was used. 0.1 g of the silicon structures was dispersed in 200 ml of ethanol, and this was coated on graphite fiber textile and dried at 25° C. and dried to obtain a Si/GF material including the graphite fiber textile, silicon nanoparticles formed on the graphite fiber textile, and silicon oxide (SiOx, wherein $0<x<2$) layer formed on the silicon nanoparticles.

In the Si/GF material, a content of the graphite fiber textile was about 95 parts by weight, and a content of the silicon structures (including the silicon nanoparticles and the silicon oxide layer formed thereon) was about 5 parts by weight based on 100 parts by weight of total weight of the Si/GF material.

Comparative Example 4

A slurry was prepared by mixing lithium-substituted polyacrylate (Li-PAA) with the Si/GF material prepared in Comparative Example 3. In the slurry, a solid content mixture ratio of the Si/GF material of Comparative Example 3 and the Li-PAA was 88:12 weight ratio.

The slurry was coated on a substrate, and then a doctor blade was used to form a layer having a thickness of about 40 μm. The layer was vacuum dried at a temperature of 120° C. for 2 hours, and then the dried product was pressed to prepare a negative electrode.

A coin cell (CR2032) was prepared by sing the negative electrode and a lithium metal, as a counter electrode.

A separator was a polypropylene film (Celgard 3510), and an electrolyte was 1.3 M $LiPF_6$ including ethylene carbonate (EC), diethylene carbonate (DEC), and fluoroethylene carbonate (FEC) at a volume ratio of 2:6:2.

Comparative Example 5

An amorphous carbon and citric acid (CA) were added to the Si/GF prepared in Comparative Example 3, and the resultant was heat-treated at 400° C. for 5 hours in $N_2$. A carbon layer remained after decomposing CA was coated on the silicon to obtain an AC-Si/GF material. In the AC-Si/GF material, a content of silicon was about 5 parts by weight, and a content of the amorphous carbon was about 1 part by weight, based on 100 parts by weight of the AC-Si/GF material.

Comparative Example 6

A coin cell (CR2032) was prepared in the same manner as in Example 1, except that the AC-Si/GF material of Comparative Example 5 was used instead of the composite prepared in Example 1.

Comparative Example 7

Si/CNT (Nanostrucutred & Amorphous Materials, Inc.) was used. Here, a content of Si, was about 20 parts by weight based on 100 parts by weight of the Si/CNT.

Comparative Example 8

A coin cell was prepared in the same manner as in Example 1, except that the Si/CNT of Comparative Example 7 was used instead of the composite prepared in Example 4.

Evaluation Example 1

Scanning Electron Microscope (SEM)

1) Examples 1 and 3 and Comparative Example 1

The graphite fiber textile coated with the silicon structures (including silicon nanoparticles coated with a silicon oxide ($SiO_x$, where $0<x<2$) layer) that is used in the preparation of the composites of Examples 1 and 3 and the graphite fiber textile of Comparative Example 1 were analyzed by using a scanning electron microscope, and the results are shown in FIGS. 3A to 5C, respectively. The SEM analysis was performed by using an ultra-resolution field emission scanning electron microscope (UHR-FE-SEM; Hitachi S-5500, resolution 0.4 nm) at 30 kV.

Figure 3A:
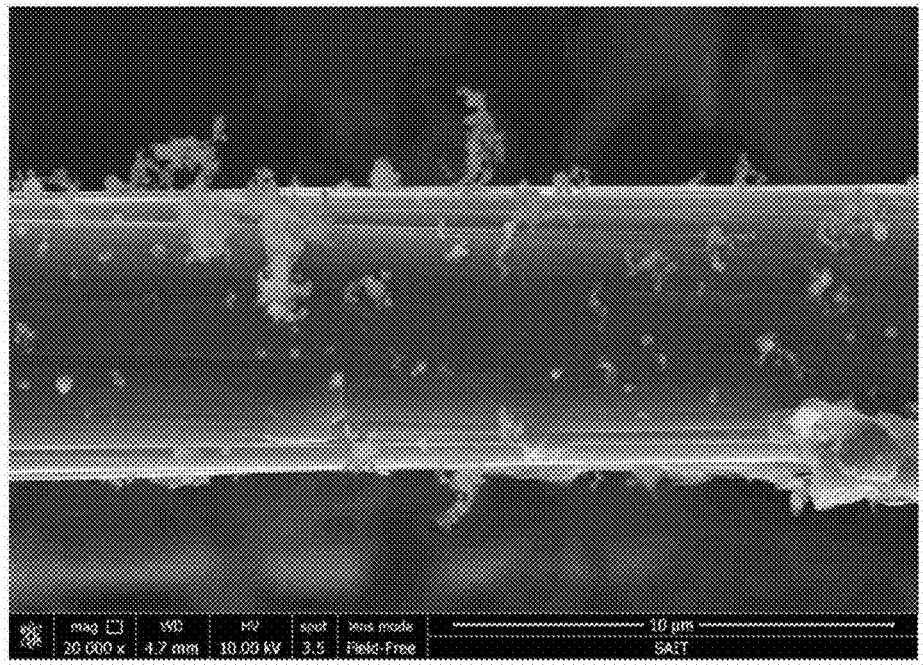
FIGS. 3A through 3C are SEM images of the composite of Example 1.
Figure 3B:
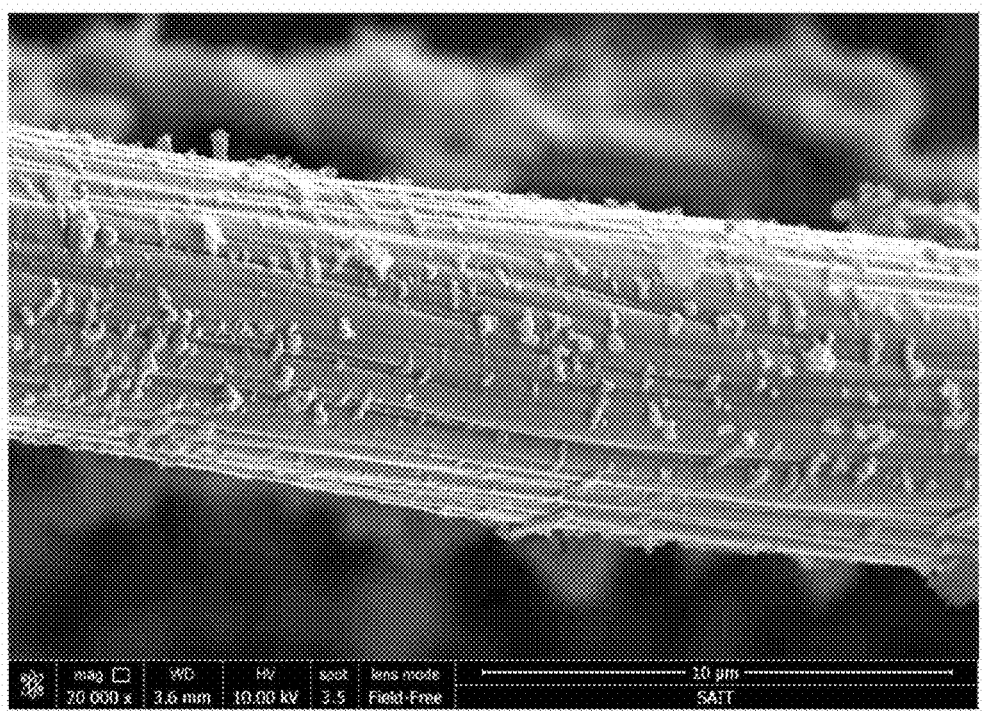
Figure 3C:
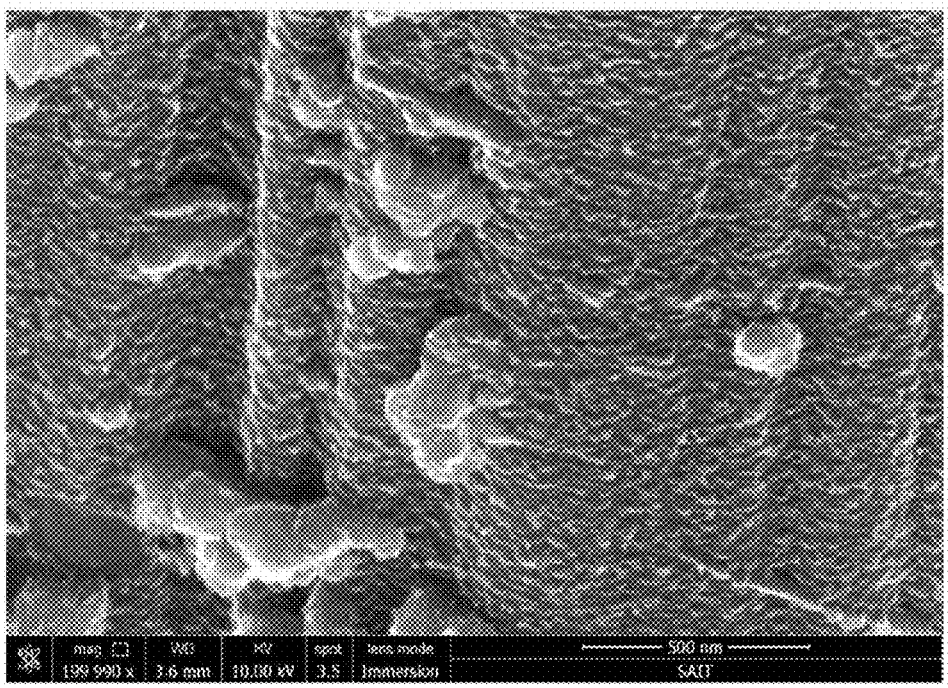
Figure 4A:
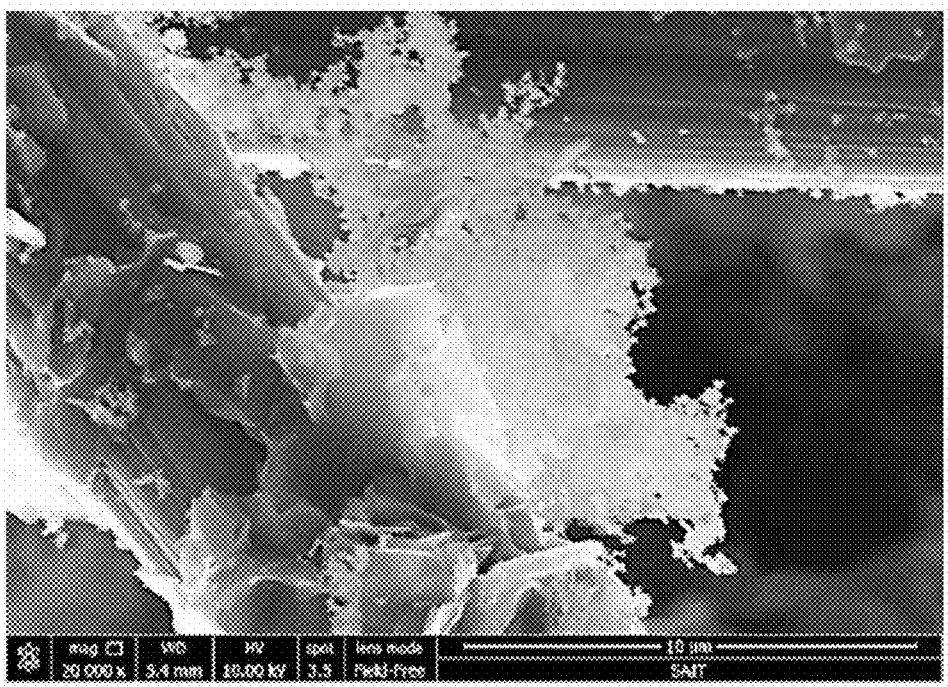
FIGS. 4A through 4C are SEM images of the composite of Example 3.
Figure 4B:
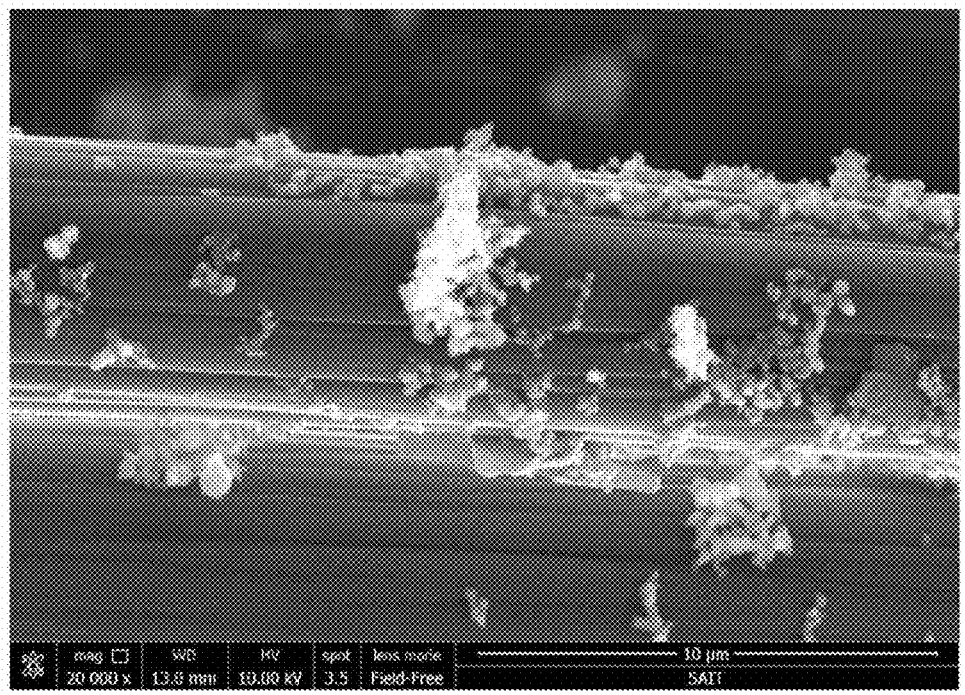
Figure 4C:
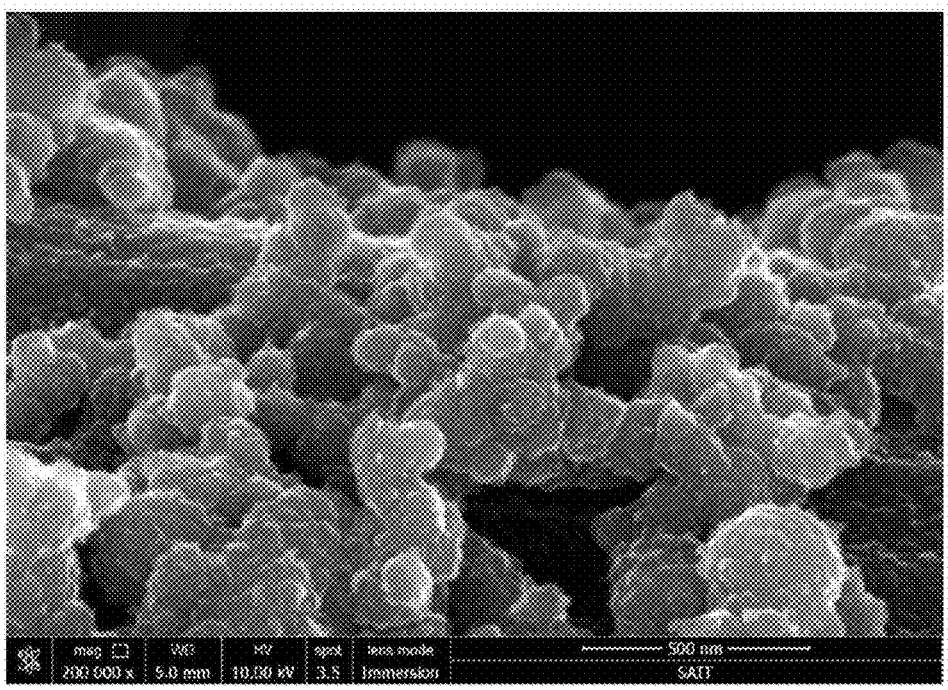
Figure 5A:
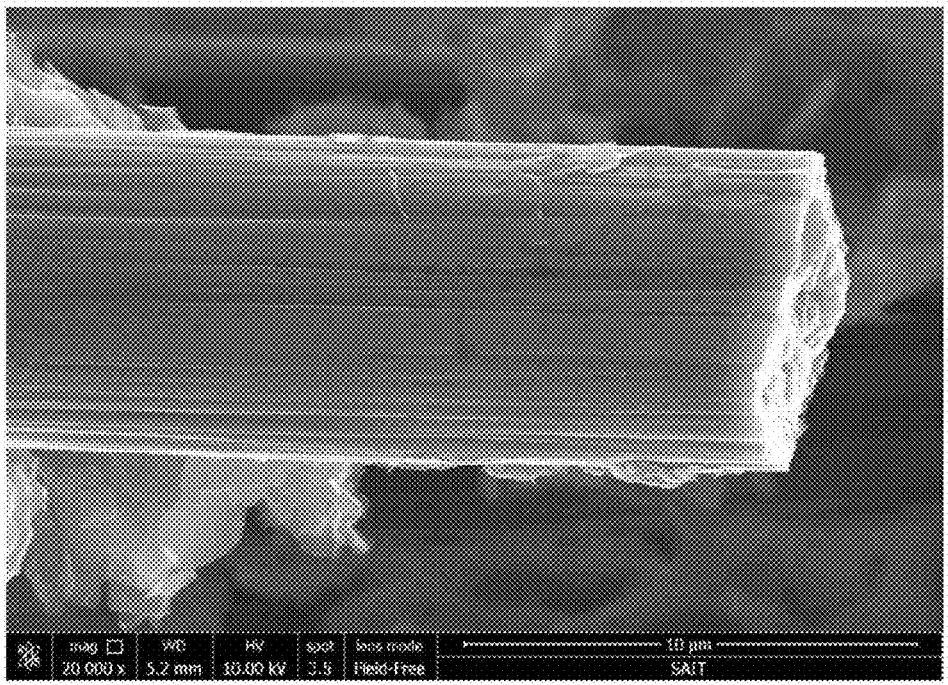
FIGS. 5A through 5C are SEM images of the graphite fiber textile of Comparative Example 1.
Figure 5B:
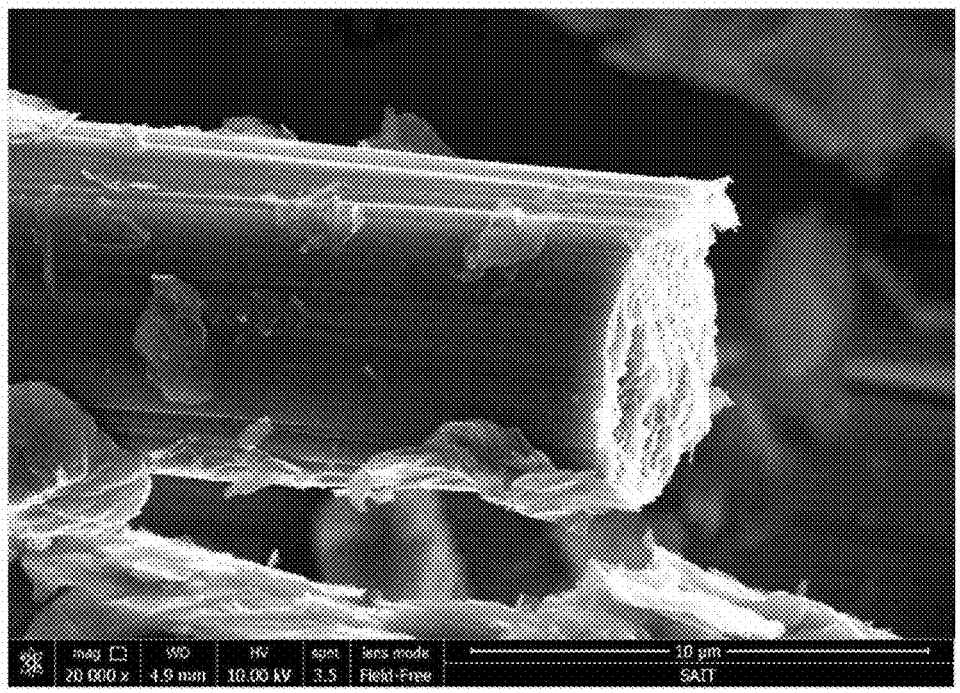
Figure 5C:
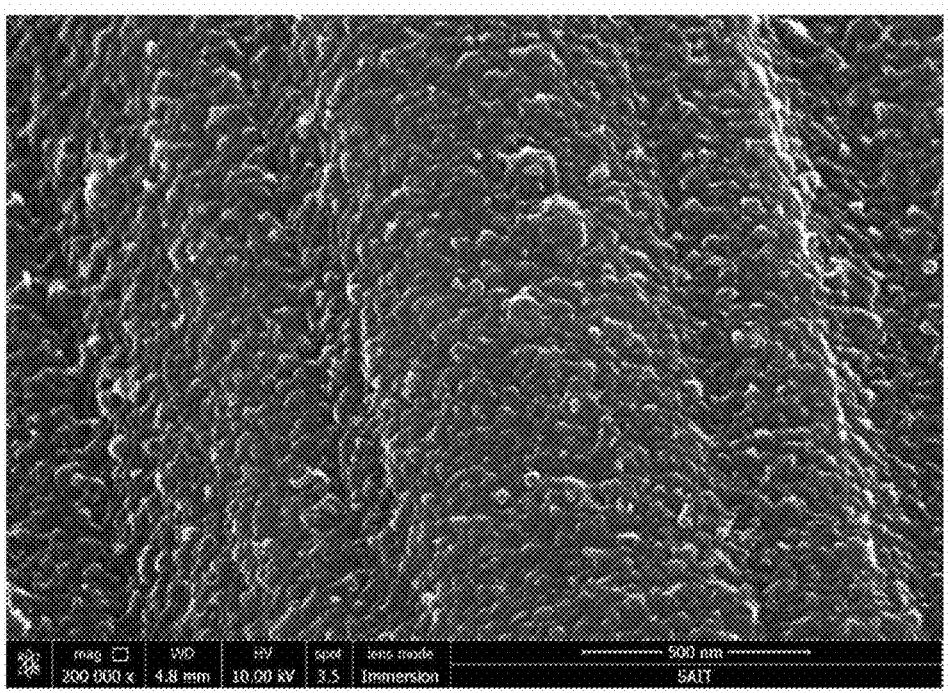

FIGS. 3A through 3C are SEM images of the composite of Example 1, and FIGS. 4A through 4C are SEM images of the composite of Example 3. Also, FIGS. 5A through 5C are SEM images of the graphite fiber textile of Comparative Example 1.

Referring to the SEM images, it may be known that the graphite fiber textile coated with the silicon structures prepared in Examples 1 and 3 had a structure in which the silicon nanoparticles are evenly dispersed on the graphite fiber textile. Particularly, the dispersion state of the silicon nanoparticles of Example 1 was better than that of the silicon nanoparticles of Example 3. This supports that an ability to disperse silicon particles in ethanol is better than that in tetrahydrofuran.

2) Example 1 and Comparative Example 1

Figure 7A:
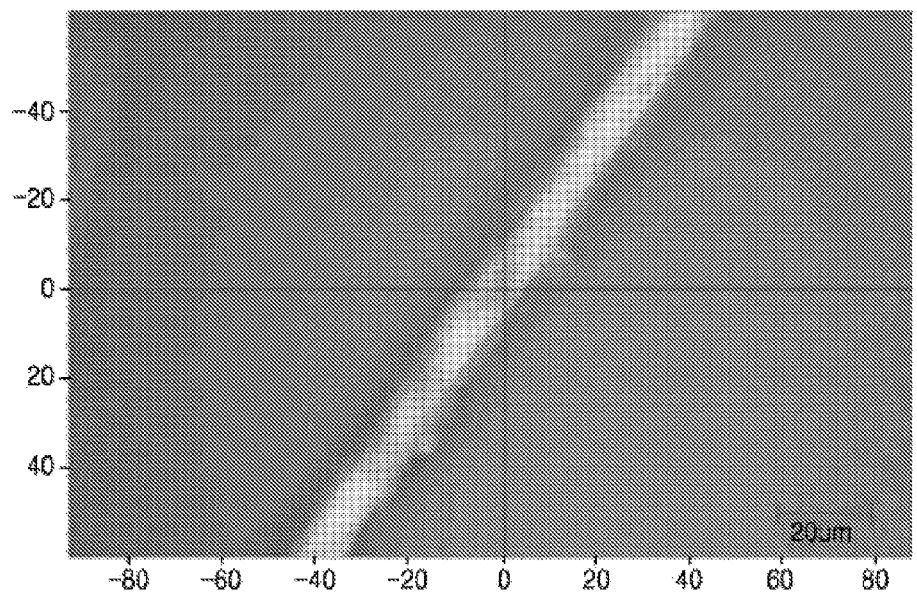
FIGS. 7A and 7B are SEM images of the composite prepared in Example 1 and the graphite fiber textile prepared in Comparative Example 1, respectively.
Figure 7B:
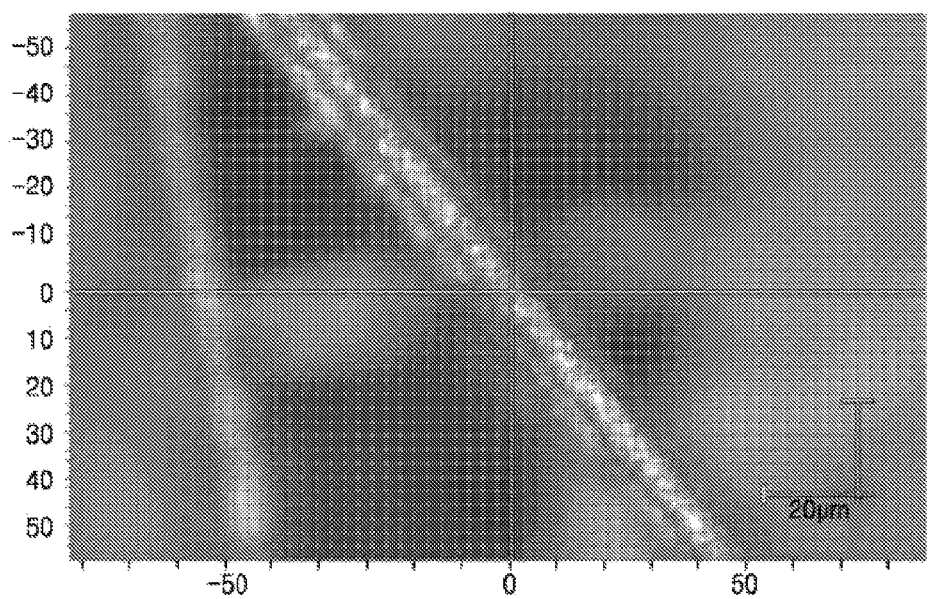

SEM analysis was performed on the composite of Example 1 and the graphite fiber textile of Comparative Example 1. The results of the SEM analysis are shown in FIGS. 7A and 7B.

Referring to the analysis results, it may be known that the silicon particles have a structure that anchors on the graphite fiber textile due to graphene direct growth.

Evaluation Example 2

Transmission Electron Microscope (TEM)

TEM analysis was performed on the composite prepared in Example 2.

The analysis instrument for the TEM analysis was Titan cubed 60-300 available from FEI. The results of the TEM analysis are shown in FIGS. 6A to 6D.

Figure 6A:
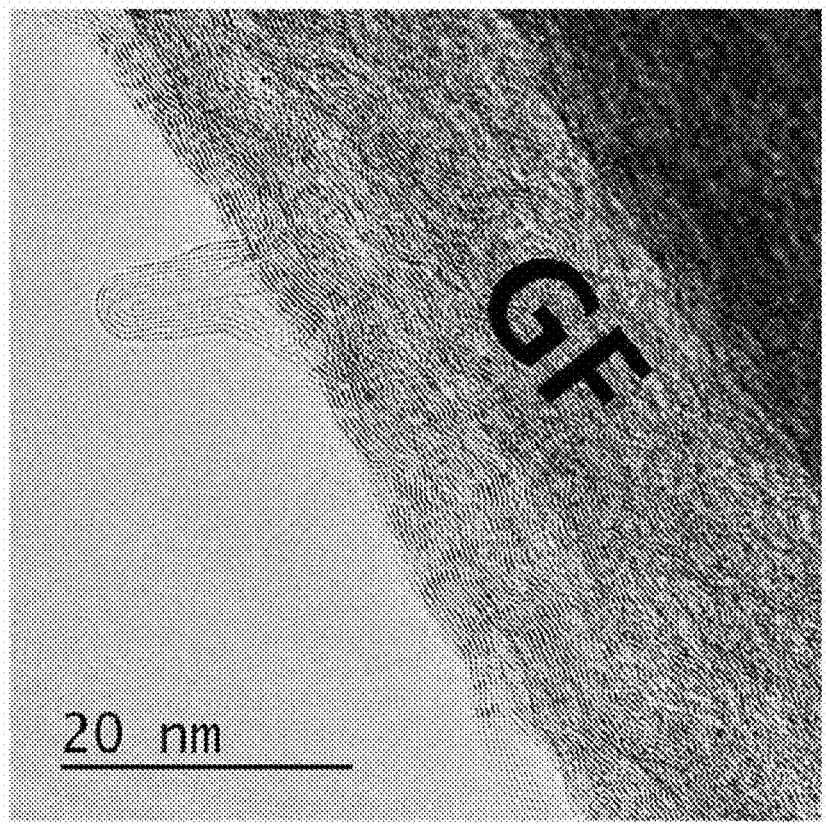
Figure 6B:
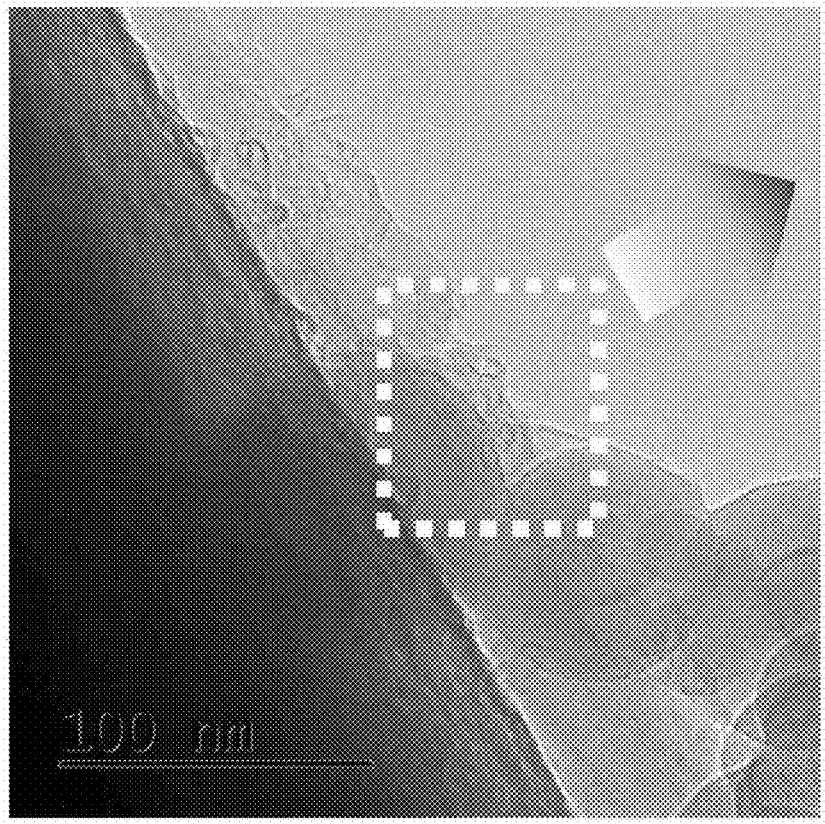
Figure 6C:
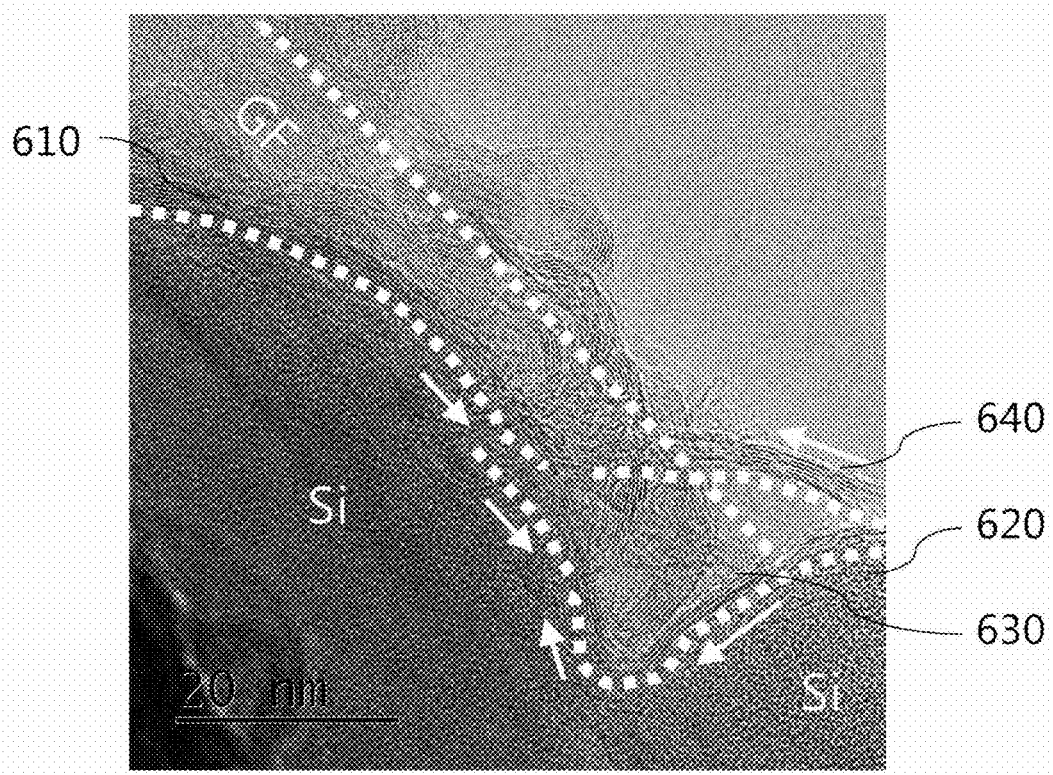
Figure 6D:
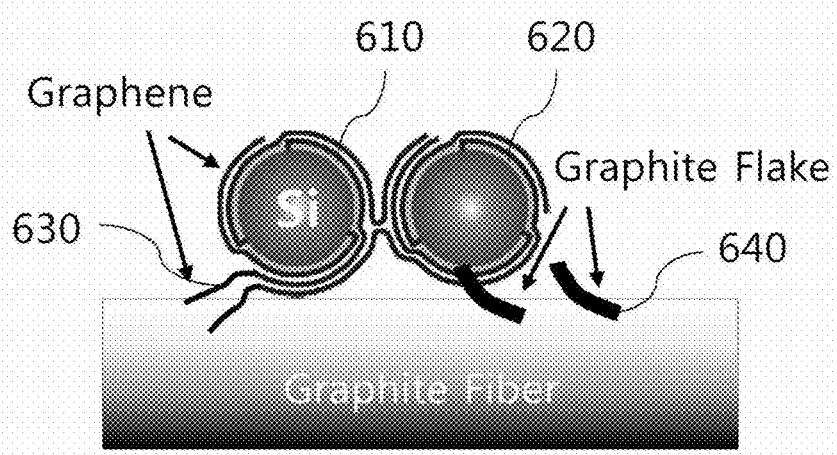
FIG. 6D is a schematic diagram of the composite shown in FIG. 6C.

Referring to the results of the TEM analysis, a network structure of the graphene-silicon/graphite fiber textile was confirmed. Referring to FIGS. 6C and 6D, a first silicon particle 610 and a second silicon particle 620 are connected by graphene 630, and, referring to FIG. 6A, graphene flakes 640 were observed. A greater amount of the flakes are generated when a gas mixture of $CH_4$ and $CO_2$ is used as a reaction gas for graphene direct growth, compared to the case when only $CH_4$ is used as the reaction gas. When an amount of the graphene flakes increases, a capacity of the electrode may relatively reduce. Also, as shown in FIG. 6C, in the electrode, silicon pulverization may less occur due to graphene interlayer sliding during silicon expansion, and the graphene may serve as a silicon protection layer. Therefore, the electrode may have excellent durability.

Evaluation Example 3

Raman Analysis

Raman analysis was performed on the composite of Example 1 and the graphite fiber textile of Comparative Example 1. Raman spectra, using a 2010 Spectra instrument (NT-MDT Development Co.) with a laser system having wavelengths of 473 nm, 633 nm, and 785 nm, a lowest Raman shift up to about 50 $cm^{-1}$, and a spatial resolution of about 500 nm was used to perform the Raman analyses.

Figure 8A:
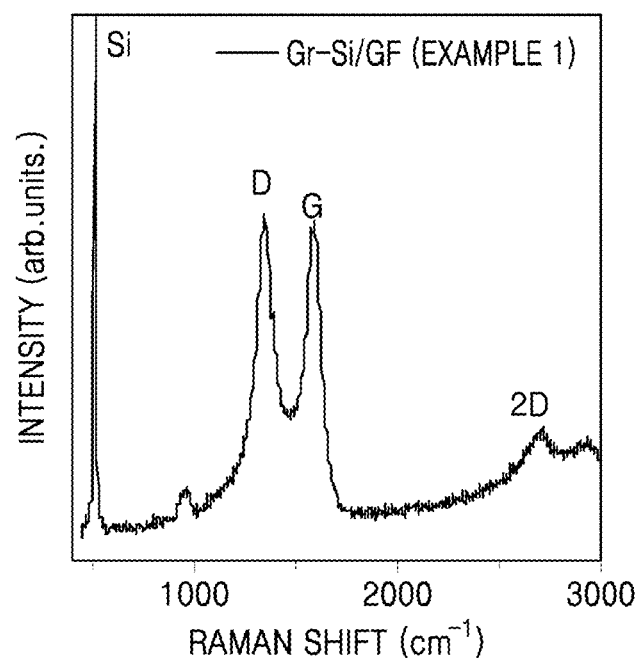
FIGS. 8A and 8B are each a graph of intensity (arbitrary units) versus Raman shift ($cm^{-1}$) which show the results of Raman analysis performed on the composite prepared in Example 1 and the graphite fiber textile prepared in Comparative Example 1, respectively.
Figure 8B:
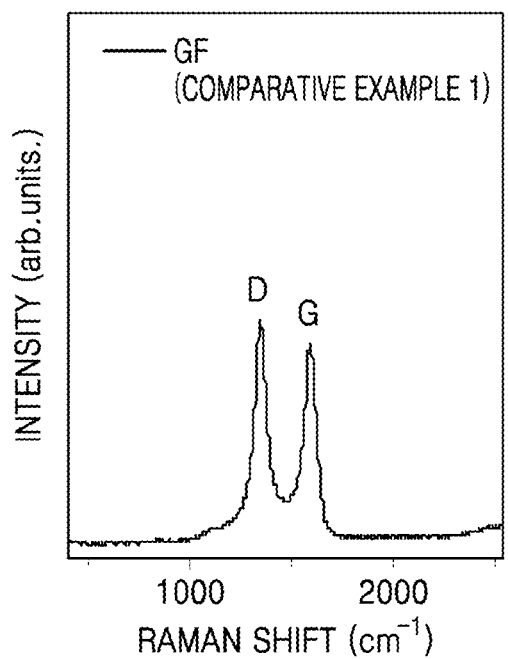

The results of the Raman analyses are as shown in FIGS. 8A and 8B. Graphene had peaks at 1350 $cm^{-1}$, 1580 $cm^{-1}$, and 2700 $cm^{-1}$ in the Raman spectrum, and the peaks provide information about a thickness, crystallinity, and a charge doping state. The peak at 1580 $cm^{-1}$ is a peak referred to as "G-mode" which is generated from a vibration mode corresponding to stretching of a carbon-carbon bond, and an energy of the G-mode is determined by a density of excess electrical charge doped by the graphene. Also, the peak at 2700 $cm^{-1}$ is a peak referred to as "2D-mode" which is useful in evaluating a thickness of the graphene. The peak at 1350 $cm^{-1}$ is a peak referred to "D-mode" which is shown when there is a defect in a $SP^2$ crystal structure. Also, a D/G intensity ratio provides information about entropy of crystals of the graphene.

Referring to FIGS. 8A and 8B, a ratio of a G peak intensity to a D peak intensity of the composite of Example 1 increased, and thus it may be known that the silicon particles are anchored to the graphite fiber textile due to the graphene in the composite.

Evaluation Example 4

Stability Before and after Electrode Bending

A bending test was performed on the coin cell prepared in Example 4 and the coin cell prepared in Comparative Example 2. Here, the bending test was performed by pressing a semi circle with a radius of 25 mm on an electrode.

After the bending test, the coin cells were each charged with a constant current of 0.2 C rate until a voltage was 4.3 V at 25° C., and charged with a constant voltage while maintaining the voltage at 4.3 V until a current was 0.05 C. Then, the cells were each discharged with a constant current of 0.2 C rate until a voltage was 3.0 V. Subsequently, the cells were each charged with a constant current of 0.5 C rate until a voltage was 4.3 V, and charged with a constant voltage while maintaining the voltage at 4.3 V until a current was 0.05 C. Next, the cells were each discharged with a constant current of 0.2 C rate until a voltage was 3.0 V.

The coin cells after the process described above were each charged with a constant current of 0.5 C rate until a voltage was 4.3 V at 25° C., and charged with a constant voltage while maintaining the voltage at 4.3 V until a current was 0.05 C. Then, the cells were each discharged with a constant current of 0.5 C until the voltage was 3.0 V, thereby completing a cycle, and the cycle was repeated 100 times.

Figure 10:
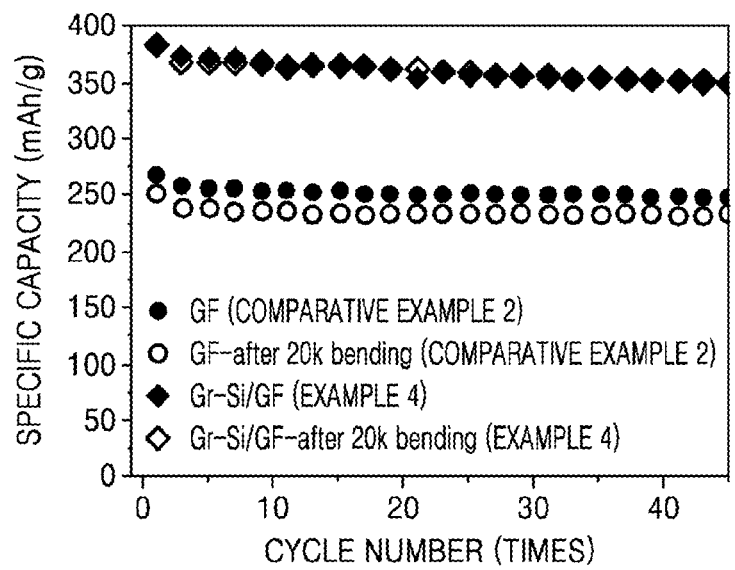
FIG. 10 is a graph of specific capacity (milliampere hours per gram (mAh/g)) versus cycle number which illustrates charging/discharging characteristics for the coin cells prepared in Example 4 and Comparative Example 2 before and after a bending test.

Some of the results of the charging/discharging test are shown in Table 1 and FIG. 10. Also, the lifespan is calculated by following Equation 1.

Capacity retention rate [%]=[Discharge capacity at $100^{th}$ cycle/Charge capacity at $1^{st}$]×100%     Equation 1

TABLE 1

| | | Discharge capacity (mAh/g, 0.1 C) | Initial efficiency (%) | Coulomb efficiency (%) | Lifespan (%) |
|---|---|---|---|---|---|
| Example 4 | Before bending | 385.4 | 80.2 | 99.7 | 96.5 |
| | After bending | 384.0 | 85.1 | 99.5 | 95.8 |
| Comparative Example 2 | Before bending | 268.3 | 82.2 | 99.7 | 96.5 |
| | After bending | 250.0 | 78.5 | 99.7 | 93 |

Referring to Table 1 and FIG. 10, the coin cell prepared in Example 4 showed improved initial efficiency before and after the bending. The improvement in initial efficiency further increases after bending due to removal of silicon that did not participate in the reaction by undergoing the bending test. Also, the coin cell prepared in Example 4 has significantly decreased lifespan and initial efficiency compared to those of the coin cell prepared in Comparative Example 2. In this regard, it may be known that decreases in a capacity, a lifespan, and an initial efficiency of the coin cell prepared in Example 4 may be suppressed by resolving delamination of the active material in the electrode compared to the case in the coin cell prepared in Comparative Example 2.

Evaluation Example 5

Charging/Discharging Characteristics

1) Examples 4 and 6 and Comparative Examples 2 and 3

Charging/discharging characteristics evaluation was performed by using the coin cells prepared in Examples 4 and 6 and Comparative Examples 2 and 3.

The coin cells were each charged with a constant current of 0.2 C rate until a voltage was 4.3 V at 25° C., and charged with a constant voltage while maintaining the voltage at 4.3 V until a current was 0.05 C. Then, the cells were each discharged with a constant current of 0.2 C rate until a voltage was 3.0 V. Subsequently, the cells were each discharged with a constant current of 0.2 C rate until a voltage was 3.0 V. Then, the coin cells were each charged with a constant current of 0.5 C rate until a voltage was 4.3 V, and charged with a constant voltage while maintaining the voltage at 4.3 V until a current was 0.05 C. Then, the cells were each discharged with a constant current of 0.2 C until the voltage was 3.0 V.

The coin cells after the process described above were each charged with a constant current of 0.5 C rate until a voltage was 4.3 V at 25° C., and charged with a constant voltage while maintaining the voltage at 4.3 V until a current was 0.05 C. Then, the cells were each discharged with a constant current of 0.5 C until the voltage was 3.0 V, thereby completing a cycle, and the cycle was repeated 100 times.

Figure 9:
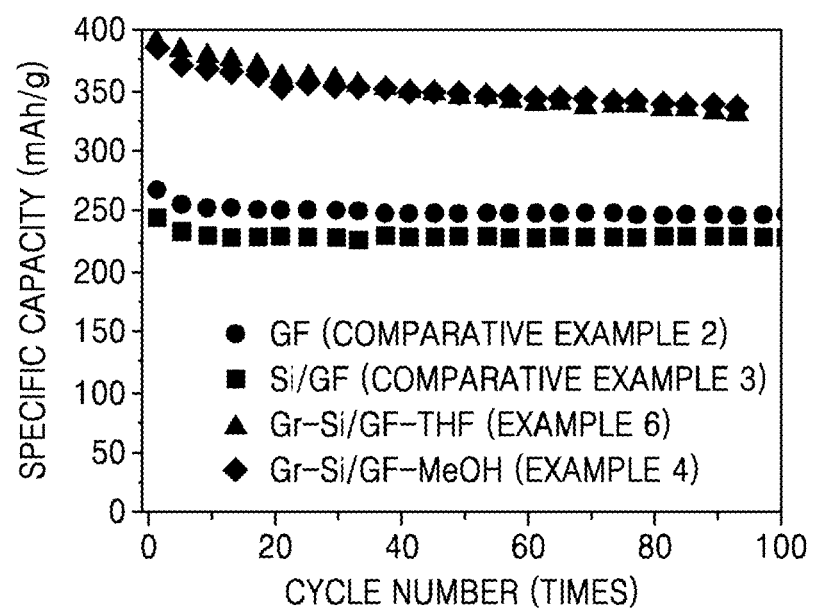
FIG. 9 is a graph of specific capacity (milliampere hours per gram (mAh/g)) versus cycle number illustrating charging/discharging characteristics for the coin cells prepared in Examples 4 and 6 and Comparative Examples 2 and 3.

Some of the results from the charging/discharging test are shown in Table 2 and FIG. 9.

TABLE 2

| | Discharge capacity (mAh/g, 0.1 C) | Initial efficiency (%) | Average coulomb efficiency (%) | Lifespan (%) |
| --- | --- | --- | --- | --- |
| Example 4 | 385.4 | 80.2 | 90.3 | 90.3 |
| Example 6 | 391.9 | 81.8 | 86.8 | 86.8 |
| Comparative Example 2 | 268.3 | 82.2 | 99.9 | 96.2 |
| Comparative Example 3 | 317.5 | 74.5 | 99.6 | 58.9 |

Referring to Table 2 and FIG. 9, the coin cell prepared in Example 4 had a reduced initial efficiency but excellent discharge capacity and improved coulomb efficiency and lifespan characteristics compared to those of the coin cell prepared in Example 6. In this regard, it may be known that ethanol is more effective in dispersing silicon than tetrahydrofuran. As shown in Table 2, in the electrodes of the coin cells of Examples 4 and 6, the composites include the graphite fiber textiles, where the composite may contain impurities, and thus initial efficiencies of the coin cells of Examples 4 and 6 appeared lower than that of the coin cell of Comparative Example 2. However, the coin cell of Comparative Example 2 includes the electrode including graphite fiber textile and thus showed significant capacity decrease in a negative electrode despite of having excellent durability and coulomb efficiency.

2) Examples 4 and 5 and Comparative Examples 2, 4, and 6

Figure 11:
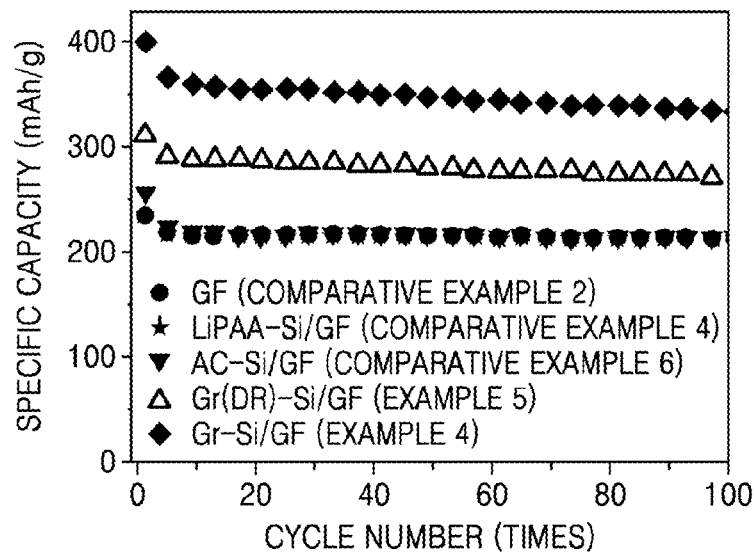
FIG. 11 is a graph of specific capacity (milliampere hours per gram (mAh/g)) versus cycle number which illustrates charging/discharging characteristics for the coin cells prepared in Examples 4 and 5 and Comparative Examples 2, 4, and 6.

Charging/discharging characteristics of the coin cells prepared in Examples 4 and 5 and Comparative Examples 2, 4, and 6 were evaluated by using the same charging/discharging characteristics evaluation used in evaluation of the coin cells prepared in Examples 4 and 6 and Comparative Example 2. The results are shown in Table 3 and FIG. 11.

TABLE 3

| | Discharge capacity (mAh/L, 0.1 C) | Discharge capacity (mAh/g, 0.1 C) | Initial efficiency (%) | Average coulomb efficiency (%) | Lifespan (%) |
| --- | --- | --- | --- | --- | --- |
| Example 4 | 140.0 | 403.5 | 85.8 | 99.2 | 91.5 |
| Example 5 | 109.2 | 313.8 | 63.1 | 99.4 | 94.8 |
| Comparative Example 2 | 50 | 268.3 | 82.2 | 99.85 | 96.2 |
| Comparative Example 4 | 81.2 | 234.9 | 68.1 | 99.72 | 50.4 |
| Comparative Example 6 | 89.1 | 256.8 | 61.4 | 99.77 | 61.5 |

Referring to FIG. 3, it may be known that a capacity and an initial efficiency of the coin cell of Example 5 using a gas mixture of $CH_4$ and $CO_2$ as a carbonaceous source gas in the formation of graphene decreased compared to those of the coin cell of Example 4 prepared by using $CH_4$ only. In this regard, when the gas mixture of $CH_4$ and $CO_2$ is used, unlike when only $CH_4$ is used, a capacity and an initial efficiency of a lithium battery decrease due to a further formation of a silicon oxide ($SiO_x$) layer.

On the other hand, discharge capacity characteristics of the coin cell of Comparative Example 2 were deteriorated, and lifespan characteristics of the coin cells of Comparative Examples 4 and 6 were deteriorated.

3) Examples 4 and 8 and Comparative Example 2

Figure 12:
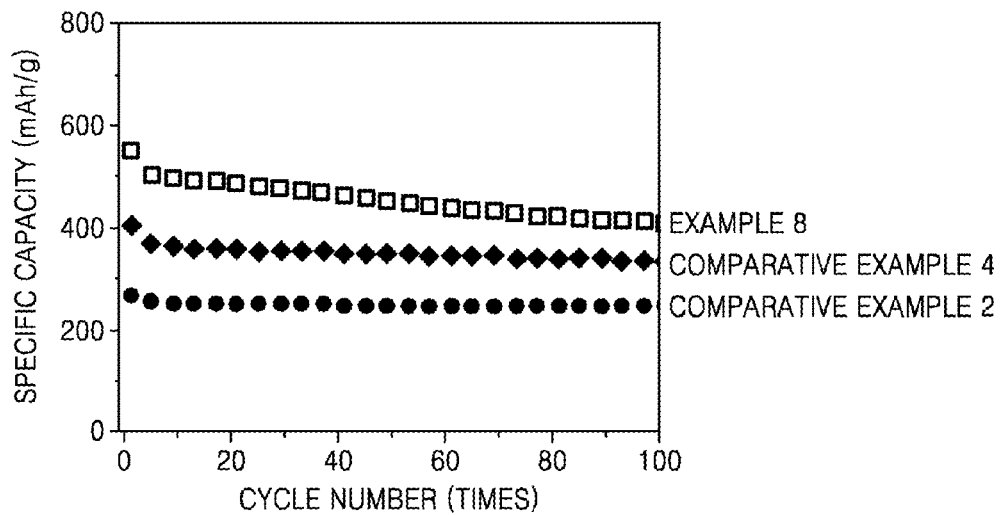
FIG. 12 is a graph of specific capacity (milliampere hours per gram (mAh/g)) versus cycle number which illustrates charging/discharging characteristics for the coin cells prepared in Examples 4 and 8 and Comparative Example 2.

Charging/discharging characteristics of the coin cells prepared in Examples 4 and 8 and Comparative Example 2 were evaluated by using the same charging/discharging characteristics evaluation used in evaluation of the coin cells prepared in Examples 4 and 6 and Comparative Example 2. The results of the charging/discharging characteristics evaluation are shown in Table 4 and FIG. 12. FIG. 12 shows a specific capacity change according to the number of cycle in the coin cells prepared in Examples 4 and 8 and Comparative Example 2 after repeating 100 charging/discharging cycles.

TABLE 4

| | Discharge capacity (mAh/L, 0.1 C) | Discharge capacity (mAh/g, 0.1 C) | Initial efficiency (%) | Average coulomb efficiency (%) | Lifespan (%) |
| --- | --- | --- | --- | --- | --- |
| Example 4 (Content of Si: 5 parts by weight) | 140.0 | 403.5 | 85.8 | 99.2 | 91.5 |
| Example 8 (Content of Si: 10 parts by weight) | 220.5 | 552.3 | 85.6 | 99.0 | 80.6 |
| Comparative Example 2 | 50 | 268.3 | 82.2 | 99.85 | 96.2 |

Referring to Table 4 and FIG. 12, the coin cells prepared in Examples 4 and 8 had excellent capacity, coulomb efficiency, and lifespan characteristics. However, the coin cell prepared in Comparative Example 2 had excellent coulomb efficiency and lifespan characteristics but a low capacity. Also, as it may be known from the capacity, initial efficiency, average coulomb efficiency, and lifespan characteristics of the coin cells prepared in Examples 4 and 8, when a content of silicon increases, the average coulomb efficiency, initial efficiency, and lifespan characteristics deteriorate. In this regard, it may be known that performance of a coin cell deteriorates by isolation phenomenon of a silicon active material as an Si—Si interaction degrades during charging/discharging of a battery.

Also, charging/discharging characteristics of the coin cell prepared in Example 8 was evaluated by using the same charging/discharging characteristics evaluation used in evaluation of the coin cells prepared in Examples 4 and 6 and Comparative Example 2. The number of charging/discharging cycle performed on the coin cell of Example 8 was 200.

Figure 15A:
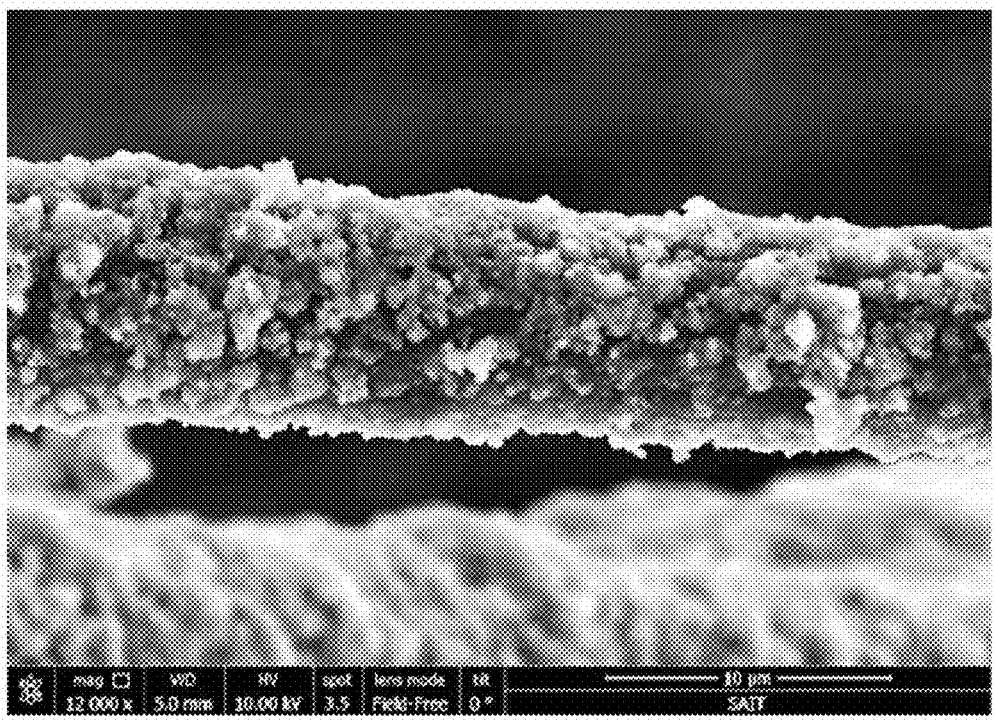
FIGS. 15A and 15B are SEM images of a negative electrode in the coin cell prepared in Example 8 after performing a charging/discharging cycle.
Figure 15B:
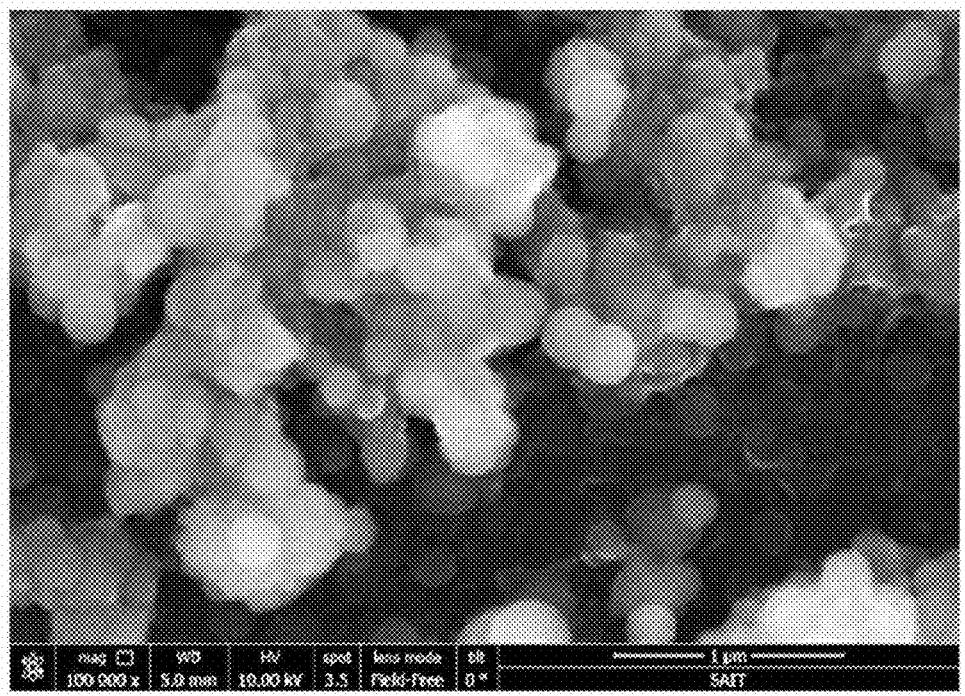
Figure 15C:
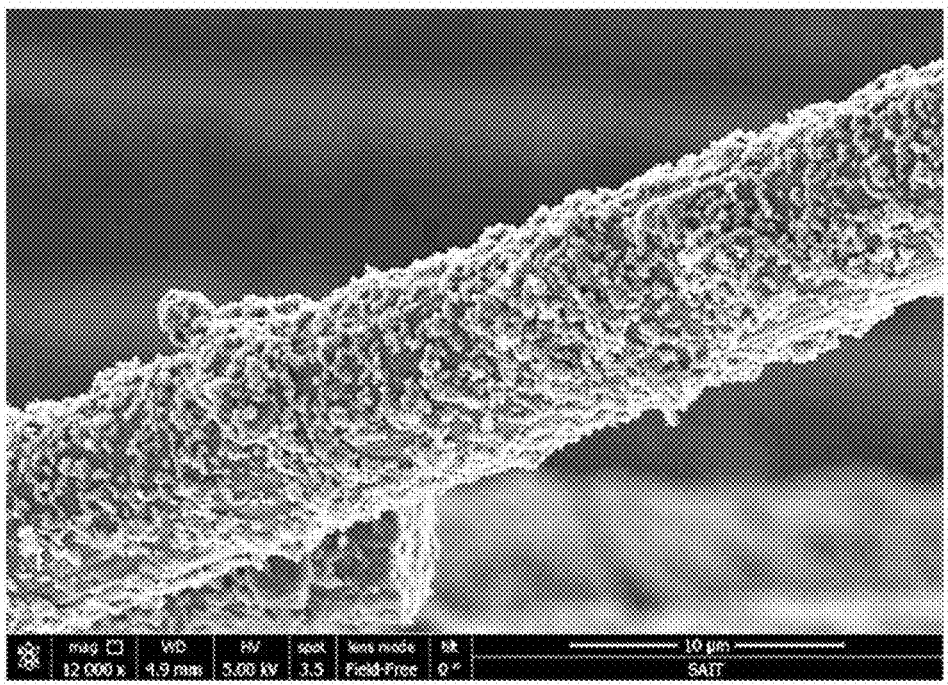
FIGS. 15C and 15D are SEM images of the negative electrode in the coin cell prepared in Example 8 before performing a charging/discharging cycle.
Figure 15D:
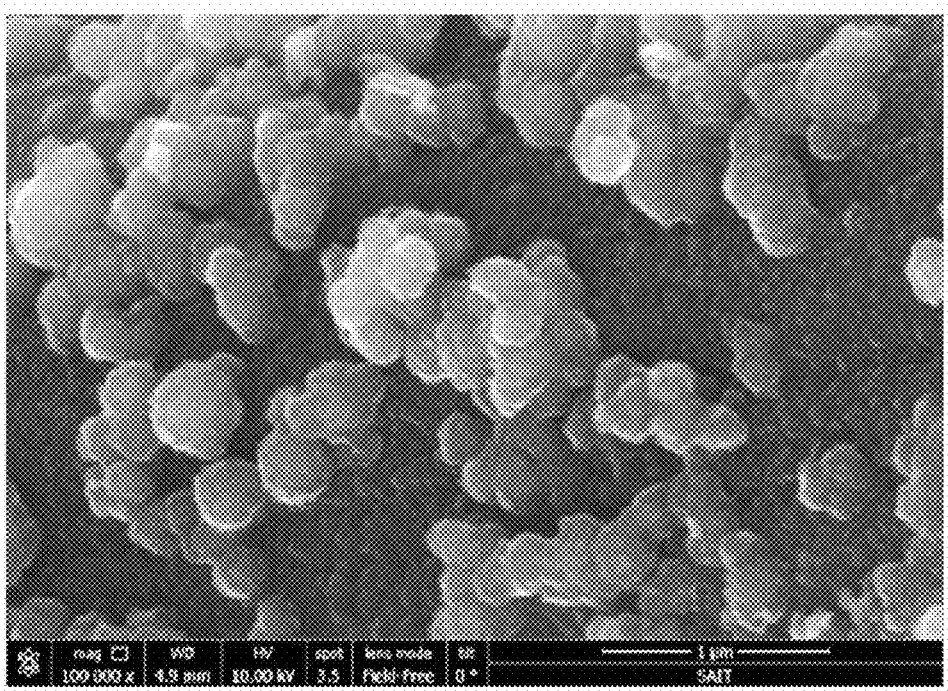

FIGS. 15C and 15D are SEM images of samples including graphene-coated Si particles on GF in the composite before the 200 charging/discharging cycles, and FIGS. 15A and 15B are SEM images of the samples after the 200 charging/discharging cycles.

Referring to the SEM images, it may be known that the graphene coating structure was maintained the same after the 200 charging/discharging cycles.

4) Examples 11 and 12 and Comparative Example 8

Charging/discharging characteristics of the coin cells prepared in Examples 11 and 12 and Comparative Example 8 were evaluated by using the same charging/discharging characteristics evaluation used in evaluation of the coin cells prepared in Examples 4 and 8 and Comparative Example 2.

Figure 13:
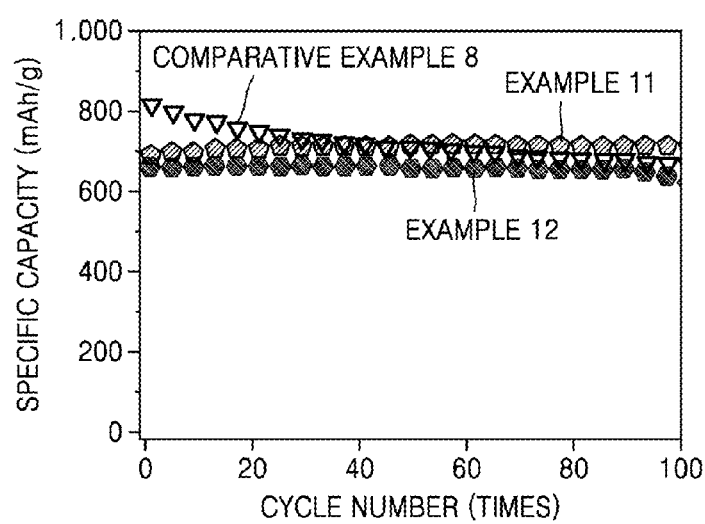
FIG. 13 is a graph of specific capacity (milliampere hours per gram (mAh/g)) versus cycle number which illustrates specific capacity change for the coin cells prepared in Examples 11 and 12 and Comparative Example 8 according to the number of cycles.

The results of the charging/discharging characteristics evaluation are shown in Table 5 and FIG. 13.

FIG. 13 shows a specific capacity change according to the number of cycle in the coin cells prepared in Examples 11 and 12 and Comparative Example 8 after repeating 100 charging/discharging cycles.

TABLE 5

|  | Initial efficiency (%) | Average coulomb efficiency (%) | Lifespan (%) |
|---|---|---|---|
| Example 11 | 18.5 | 99.1 | 95.3 |
| Example 12 | 24.8 | 98.6 | 95.1 |
| Comparative Example 8 | 20.6 | 97.7 | 80 |

Referring to Table 5 and FIG. 13, average coulomb efficiency and lifespan characteristics of the coin cell of Example 11 improved compared to those of the coin cell of Comparative Example 8. In this regard, it may be known that when carbon nanotubes with improved specific surface area is used instead of the graphite fiber textile, a capacity of the composite may increase, and a coin cell with improved durability may be manufactured when the coin cell includes the composite.

The coin cell of Example 12 had improved lifespan characteristics compared to those of the coin cell of Comparative Example 8, but the coin cell of Example 11 had a lower initial efficiency than that of the coin cell of Comparative Example 8. The reason for the lower initial efficiency in the coin cell of Example 11 than that of the coin cell of Comparative Example 8 is caused by use of CNTs, and an amount of the CNT is high. This may be resolved by using a pre-lithiation method.

As described above, according to the disclosed embodiments, a composite has a suitable anchoring effect of a silicon structure with respect to a carbonaceous material, and thus lifespan characteristics of a lithium battery including an electrode including the composite may improve even after repeated charging/discharging of the battery. Also, adhesiveness between the silicon structure and graphene in the composite is high, and thus a conductivity of the composite is high. Therefore, when the electrode including the composite is used, high rate charging/discharging characteristics of the battery may improve, volume expansion occurring during a charging/discharging process may decrease, a clamping layer may be maintained by using flexibility of graphene during the volume expansion, and thus formation of a solid electrolyte interphase (SEI) layer may be suppressed so that a lithium battery with improved charging/discharging efficiency may be manufactured.

It should be understood that exemplary embodiments described herein should be considered in a descriptive sense only and not for purposes of limitation. Descriptions of features or aspects within each exemplary embodiment should be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope as defined by the following claims.

What is claimed is:

1. A composite comprising:
a carbonaceous material;
a plurality of silicon structures disposed on the carbonaceous material; and
a graphene layer, which comprises graphene and is disposed on the plurality of silicon structures,
wherein a silicon structure of the plurality of silicon structures comprises
silicon, and
a silicon oxide of the formula $SiO_x$ which is disposed on a surface of the silicon, wherein $0<x<2$.

2. The composite of claim 1, wherein the graphene layer is disposed between the silicon oxide and the carbonaceous material, and
wherein the graphene layer anchors the silicon structure of the plurality of silicon structures to the carbonaceous material.

3. The composite of claim 1, wherein the silicon structures of the plurality of silicon structures are connected by the graphene layer.

4. The composite of claim 1, wherein the carbonaceous material comprises at least one selected from a graphite fiber textile, carbon nanotube, carbon nanotube bundle, and carbon fiber.

5. The composite of claim 1, wherein the carbonaceous material and the plurality of silicon structures, which are disposed on the carbonaceous material, form a twist aligned carbon nanotube-silicon structure.

6. The composite of claim 1,
wherein the carbonaceous material comprises carbon nanotubes,
wherein the plurality of silicon structures are disposed on the carbon nanotubes, and
wherein the graphene layer is disposed on the plurality of silicon structures.

7. The composite of claim 6, wherein the carbon nanotubes, the silicon structures, and the graphene layer are the form of a bundle.

8. The composite of claim 1,
wherein an amount of the plurality of silicon structures is about 1 part to about 98 parts by weight, based on 100 parts by weight of the composite, and
wherein an amount of the graphene layer is in a range of about 1 part to about 30 parts by weight, based on 100 parts by weight of the composite.

9. The composite of claim 1, wherein a thickness of the silicon oxide of the plurality of silicon structures is 300 micrometers or less.

10. The composite of claim 1, wherein a 2D peak of graphene of the graphene layer is observed in a range of about 2600 cm$^{-1}$ to about 2800 cm$^{-1}$, when the composite is analyzed by Raman spectroscopy.

11. The composite of claim 1, wherein the graphene layer comprises 1 to 15 layers of graphene.

12. The composite of claim 1, wherein the graphene extends to a distance of about 10 nanometers or less from the silicon of the silicon structure.

13. The composite of claim 12, wherein the graphene extends to a distance of about 1 nanometer or less from the silicon of the silicon structure.

14. An electrode comprising:
a carbonaceous material;
a plurality of silicon structures disposed on the carbonaceous material; and
a graphene layer, which comprises graphene and is disposed on the plurality of silicon structures, wherein a silicon structure of the plurality of silicon structures comprises a composite comprising
silicon, and
a silicon oxide of the formula $SiO_x$, wherein $0<x<2$, disposed on a surface of the silicon.

15. The electrode of claim 14, wherein the graphene extends to a distance of about 10 nanometers or less from the silicon of the silicon structure.

16. The electrode of claim 15, wherein the graphene extends to a distance of about 1 nanometer or less from the silicon of the silicon structure.

17. A lithium battery comprising the electrode of claim 14.

18. A method of preparing a composite, the method comprising:
disposing a composition comprising a plurality of silicon structures and a solvent on a carbonaceous material to form a coating, wherein a silicon structure of the plurality of silicon structures comprises
silicon, and
a silicon oxide of the formula $SiO_x$ which is disposed on a surface of the silicon, wherein $0<x<2$;
drying the coating to obtain a precursor structure, which comprises the carbonaceous material and the plurality of silicon structures coated on the carbonaceous material;
contacting the precursor structure with a carbonaceous source gas; and
heat-treating carbonaceous source gas and the precursor structure to prepare the composite, wherein the composite comprises
a carbonaceous material,
a plurality of silicon structures disposed on the carbonaceous material; and
a graphene layer, which comprises graphene and is disposed on the plurality of silicon structures, wherein a silicon structure of the plurality of silicon structures comprises silicon, and a silicon oxide of the formula $SiO_x$ which is disposed on a surface of the silicon, wherein $0<x<2$.

19. The method of claim 18, wherein the solvent comprises at least one selected from isopropyl alcohol, methanol, ethanol, butanol, and tetrahydrofuran.

20. The method of claim 18, wherein the carbonaceous source gas comprises at least one selected from a compound represented by Formula 1, a compound represented by Formula 2, and an oxygen-containing gas represented by Formula 3:

$$C_nH_{(2n+2-a)}(OH)_a \qquad \text{Formula 1}$$

wherein, in Formula 1, n is an integer of 1 to 20, and a is an integer of 0 or 1, $$C_nH_{2n} \qquad \text{Formula 2}$$

wherein, in Formula 2, n is an integer of 2 to 6, and $$C_xH_yO_z \qquad \text{Formula 3}$$

wherein, in Formula 3, x is an integer of 0 or 1 to 20, y is an integer of 0 or 1 to 20, and z is an integer of 1 or 2.

21. The method of claim 20, wherein the oxygen-containing gas is at least one selected from carbon dioxide, carbon monoxide, and water.

22. The method of claim 20, wherein the carbonaceous source gas further comprises at least one inert gas selected from nitrogen, helium, and argon.

23. The method of claim 20, wherein the compound represented by Formula 1 and the compound represented by Formula 2 are at least one selected from methane, ethylene, propylene, methanol, ethanol, and propanol.

24. The method of claim 20, wherein the carbonaceous source gas is methane; a gas mixture comprising methane and an inert gas; an oxygen-containing gas; or a gas mixture comprising methane and an oxygen-containing gas.

25. The method of claim 24, wherein the carbonaceous source gas is methane or a gas mixture of methane and carbon dioxide.

26. The method of claim 18, wherein the heat-treating is performed at a temperature in a range of about 700° C. to about 1100° C.

* * * * *